United States Patent
Kurtz et al.

(10) Patent No.: US 7,697,053 B2
(45) Date of Patent: *Apr. 13, 2010

(54) INTEGRATED DISPLAY HAVING MULTIPLE CAPTURE DEVICES

(75) Inventors: Andrew F. Kurtz, Macedon, NY (US); John N. Border, Walworth, NY (US); Ronald S. Cok, Rochester, NY (US)

(73) Assignee: Eastman Kodak Company, Rochester, NY (US)

( * ) Notice: Subject to any disclaimer, the term of this patent is extended or adjusted under 35 U.S.C. 154(b) by 713 days.

This patent is subject to a terminal disclaimer.

(21) Appl. No.: 11/555,822

(22) Filed: Nov. 2, 2006

(65) Prior Publication Data

US 2008/0106629 A1    May 8, 2008

(51) Int. Cl.
*H04N 7/14* (2006.01)
*H04N 5/222* (2006.01)
*H04N 5/225* (2006.01)
*H04N 11/00* (2006.01)

(52) U.S. Cl. .............. 348/333.01; 348/14.01; 348/14.16; 348/340; 348/552; 345/88; 345/175

(58) Field of Classification Search ............ 348/14.16
See application file for complete search history.

(56) References Cited

U.S. PATENT DOCUMENTS

| | | | |
|---|---|---|---|
| 4,769,292 A | | 9/1988 | Tang et al. |
| 4,928,301 A | | 5/1990 | Smoot |
| 5,061,569 A | | 10/1991 | VanSlyke et al. |
| 5,159,445 A | * | 10/1992 | Gitlin et al. .............. 348/14.01 |
| 5,194,955 A | | 3/1993 | Yoneta et al. |
| 5,585,817 A | * | 12/1996 | Itoh et al. .................. 345/104 |
| 5,639,151 A | | 6/1997 | McNelley et al. |
| 5,777,665 A | | 7/1998 | McNelley et al. |
| 6,454,414 B1 | | 9/2002 | Ting |
| 6,473,238 B1 | * | 10/2002 | Daniell ....................... 359/622 |
| 6,771,303 B2 | | 8/2004 | Zhang et al. |
| 6,888,562 B2 | | 5/2005 | Rambo et al. |

(Continued)

FOREIGN PATENT DOCUMENTS

EP    1 209 901    5/2002

(Continued)

OTHER PUBLICATIONS

Gorrn et al, Towards see-thorugh displays: fully transparent thin-film transistors driving transparent organic light-emitting diodes, Adv. Mat. 2006 18(6) 738-741.

*Primary Examiner*—Sinh Tran
*Assistant Examiner*—Wanda M Negron
(74) *Attorney, Agent, or Firm*—Raymond L. Owens

(57) ABSTRACT

An integrated imaging apparatus for displaying images while capturing images of a scene, including an electronic display having an array of display pixels which are used to display image content; a plurality of apertures are integrated within the display, wherein each of the apertures includes at least one partially transparent pixel; and a plurality of capture devices each of which captures an image, and includes at least a lens and an image sensor array; wherein each capture device is operatively associated with at least part of a particular aperture of the display; and wherein the partially transparent pixels also provide light for image content display.

22 Claims, 19 Drawing Sheets

U.S. PATENT DOCUMENTS

| | | |
|---|---|---|
| 7,034,866 B1 | 4/2006 | Colmenarez et al. |
| 7,042,486 B2 | 5/2006 | Manico et al. |
| 2003/0071932 A1* | 4/2003 | Tanigaki .................. 349/61 |
| 2004/0140973 A1 | 7/2004 | Zanaty |
| 2004/0196360 A1 | 10/2004 | Hillis et al. |
| 2004/0263670 A1* | 12/2004 | Yamasaki .................. 348/340 |
| 2005/0024489 A1 | 2/2005 | Fredlund et al. |
| 2005/0128332 A1* | 6/2005 | Tsuboi .................. 348/333.12 |
| 2006/0007222 A1 | 1/2006 | Uy |
| 2007/0002130 A1* | 1/2007 | Hartkop .................. 348/14.16 |

FOREIGN PATENT DOCUMENTS

| | | |
|---|---|---|
| EP | 1536399 | 1/2005 |
| GB | 2273411 A * | 6/1994 |

* cited by examiner

INTEGRATED DISPLAY HAVING MULTIPLE CAPTURE DEVICES

CROSS REFERENCE TO RELATED APPLICATIONS

Reference is made to commonly assigned U.S. patent application Ser. No. 11/341,945 filed Jan. 27, 2006, entitled "EL Device Having Improved Power Distribution" by Ronald S. Cok et al; U.S. patent application Ser. No. 11/555,819 filed concurrently herewith, entitled "An Integrated Display and Capture Apparatus" by Ronald S. Cok et al and U.S. patent application Ser. No. 11/555,834 filed concurrently herewith, entitled "Two Way Communication System" by Ronald S. Cok et al, the disclosures of which are incorporated herein.

FIELD OF THE INVENTION

The present invention relates to apparatus for two-way communication of images and in particular relates to an integrated capture and display apparatus that provides both image display and image capture functions.

BACKGROUND OF THE INVENTION

Two-way video systems are available that include a display and camera in each of two locations connected by a communication channel that allows communication of video images and audio between two different sites. Originally, such systems relied on setup at each site of a video monitor to display a remote scene and a separate video camera, located on or near the edge of the video monitor, to capture a local scene, along with microphones to capture the audio and speakers to present the audio thereby providing a two-way video and audio telecommunication system between two locations.

Referring to FIG. 1, a typical prior art two-way telecommunication system is shown wherein a first viewer 71 views a first display 73. A first image capture device 75, which can be a digital camera, captures an image of the first viewer 71. If the image is a still digital image, it can be stored in a first still image memory 77 for retrieval. A still image retrieved from first still image memory 77 or video images captured directly from the first image capture device 75 will then be converted from digital signals to analog signals using a first D/A converter 79. A first modulator/demodulator 81 then transmits the analog signals using a first communication channel 83 to a second display 87 where a second viewer 85 can view the captured image(s).

Similarly, second image capture device 89, which can be a digital camera, captures an image of second viewer 85. The captured image data is sent to a second D/A converter 93 to be converted to analog signals but can be first stored in a second still image memory 91 for retrieval. The analog signals of the captured image(s) are sent to a second modulator/demodulator 95 and transmitted through a second communication channel 97 to the first display 73 for viewing by first viewer 71.

Although such systems have been produced and used for teleconferencing and other two-way communications applications, there are some significant practical drawbacks that have limited their effectiveness and widespread acceptance. Expanding the usability and quality of such systems has been the focus of much recent research, with a number of proposed solutions directed to more closely mimicking real-life interaction and thereby creating a form of interactive virtual reality. A number of these improvements have focused on communication bandwidth, user interface control, and the intelligence of the image capture and display components of such a system. Other improvements seek to integrate the capture device and display to improve the virtual reality environment.

There have been a number of solutions proposed for addressing the problem of poor eye contact that is characteristic of many existing solutions. With conventional systems that follow the pattern of FIG. 1, poor eye contact results from locating the video camera on a different optical axis than the video monitor and causes the eyes of an observed participant to appear averted, which is undesirable for a video communication system. Traditional solutions for addressing this problem, employing a display, camera, beam splitter, and screen, are described in a number of patents, including U.S. Pat. No. 4,928,301 entitled "Teleconferencing terminal with camera behind display screen" to Smoot; U.S. Pat. No. 5,639,151 entitled "Pass-through reflective projection display" and U.S. Pat. No. 5,777,665 entitled "Image blocking teleconferencing eye contact terminal" to McNelley, et al.; and U.S. Pat. No. 5,194,955 entitled "Video telephone" to Yoneta et al., for example. Alternately, commonly assigned U.S. Patent Application Publication No. 2005/0024489 entitled, "Image capture and display device" by Fredlund et al. describes a display device for capturing and displaying images along a common optical axis. The device includes a display panel, having a front side and a back side, capable of being placed in a display state and a transmissive state. An image capture device is provided for capturing an image through the display panel when it is in the transmissive state. An image supply source provides an image to the display panel when it is in the display state. A mechanism is also provided for alternating placing the display panel between the display state and the transmissive state, allowing a first image to be viewed and a second image to be captured of the scene in front of the display at high rates such that alternating between the display state and the transmissive state is substantially imperceptible to a user.

Commonly assigned U.S. Pat. No. 7,042,486 entitled, "Image capture and display device" to Manico et al. describes an image capture and display device that includes an electronic motion image camera for capturing the image of a subject located in front of the image display device and a digital projector for projecting the captured image. An optical element provides a common optical axis electronic camera and a light valve projection screen electronically switchable between a transparent state and a frosted state located with respect to the common optical axis for allowing the electronic camera to capture the image of the subject through the projection screen when in the transparent state and for displaying the captured image on the projection screen when in the frosted state. A controller, connected to the electronic camera, the digital projector, and the light valve projection screen, alternately places the projection screen in the transparent state allowing the electronic camera to capture an image and in the frosted state allowing the digital projector to display the captured image on the projection screen. This system relies on switching the entire display device rapidly between a transparent and a frosted state. However, with many types of conventional imaging components, this can induce image flicker and result in reduced display brightness. Furthermore, the single camera used cannot adjust capture conditions such as field of view or zoom in response to changes in scene.

Although such solutions using partially silvered mirrors and beam splitters have been implemented, their utility is constrained for a number of reasons. Solutions without a common optical axis provide an averted gaze of the participant that detracts from the conversational experience. Partially silvered mirrors and beam splitters are bulky particularly in the depth direction. Alternately transparent or semi-transparent projection display screens can be difficult to construct and with rapid alternation between states, ambient contrast can suffer and flicker can be perceptible. As a number of these solutions show, this general approach can result in a relatively bulky apparatus that has a limited field of view and is, therefore, difficult for the viewer to use comfortably.

As an alternative approach, closer integration of image display and sensing components has been proposed. For example, U.S. Patent Application Publication No. 2005/0128332, entitled "Display apparatus with camera and communication apparatus" by Tsuboi describes a portable display with a built-in array of imaging pixels for obtaining an almost full-face image of a person viewing a display. The apparatus described in the Tsuboi '8332 disclosure includes a display element in which display pixels are arranged, along with a number of aperture areas that do not contain display pixels. In its compound imaging arrangement, multiple sensors disposed behind the display panel obtain a plurality of images of the scene through a plurality of clustered lenses that are disposed over aperture areas formed among the display pixels. Each sensor then converts the sensed light photo-electrically to obtain a plurality of tiny images of portions of the scene that are then pieced together to obtain a composite image of the scene. To do this, the display apparatus must include an image-combining section that combines image information from the plurality of images obtained by using the camera.

As another variation of this type of compound imaging approach, U.S. Patent Application Publication No. 2006/0007222, entitled "Integrated sensing display" by Uy discloses a display that includes display elements integrated with image sensing elements distributed along the display surface. Each sensing pixel may have an associated microlens. As with the solution proposed in the Tsuboi '8332 disclosure, compound imaging would presumably then be used to form an image from the individual pixels of light that are obtained. As a result, similar to the device in the Tsuboi '8332 disclosure, the integrated sensing device described in the Uy '7222 application can both output images (e.g., as a display) and input light from multiple sources that can then be pieced together to form image data, thereby forming a low-resolution camera device.

Similarly, U.S. Patent Application Publication No. 2004/0140973, entitled "System and method of a video capture monitor concurrently displaying and capturing video images" by Zanaty describes an apparatus and method for compound imaging in a video capture monitor that uses a four-part pixel structure having both emissive and sensing components. Three individual emissive pixel elements display the various Red, Green, and Blue (RGB) color components of an image for display of information on the video-capture monitor. Additionally, as part of the same pixel architecture, a fourth pixel element, a sensing element, captures a portion of an image as part of a photo-electronic array on the video capture monitor. Although this application describes pixel combinations for providing both image capture and display, however, the difficulty in obtaining image quality with this type of a solution is significant and is not addressed in the Zanaty '0973 disclosure. As an example of just one problem with this arrangement, the image capture pixels in the array are not provided with optics capable of responding to changes in the scene such as movement.

The compound imaging type of solution, such as proposed in the examples of the Tsuboi '8332, Uy '7222, and Zanaty '0973 disclosures, is highly constrained for imaging and generally falls short of what is needed for image quality for the captured image. Field of view and overall imaging performance (particularly resolution) are considerably compromised in these approaches. The optical and computational task of piecing together a continuous image from numerous tiny images, each of which may exhibit considerable distortion, is daunting, requiring highly complex and costly control circuitry. In addition, imaging techniques using an array of imaging devices pointed in essentially the same direction tend to produce a series of images that are very similar in content so that it is not possible to significantly improve the overall image quality over that of one of the tiny images. Fabrication challenges, for forming multi-function pixels or intermingling image capture devices with display elements, are also considerable, indicating a likelihood of low yields, reduced resolution, reduced component lifetimes, and high manufacturing costs.

A number of other attempts to provide suitable optics for two-way display and image capture communication have employed pinhole camera components. For example, U.S. Pat. No. 6,888,562 entitled, "Integral eye-path alignment on telephony and computer video devices using a pinhole image sensing device" to Rambo et al., describes a two-way visual communication device and methods for operating such a device. The device includes a visual display device and one or more pinhole imaging devices positioned within the active display area of the visual display. An image processor can be used to analyze the displayed image and to select the output signal from one of the pinhole imaging devices. The image processor can also modify the displayed image in order to optimize the degree of eye contact as perceived by the far-end party.

In a similar type of pinhole camera imaging arrangement, U.S. Pat. No. 6,454,414 entitled "Device for image output and input" to Ting describes an input/output device including a semi-transparent display and an image capture device. To be semi-transparent, the display device includes a plurality of transparent holes. As yet another example, U.S. Pat. No. 7,034,866 entitled "Image-sensing display device with particular lens and sensor arrangement" to Colmenarez et al. describes an in-plane array of display elements alternating with pin-hole apertures for providing light to a camera.

The pinhole camera type of solution, as exemplified in the Rambo et al. '562, Ting '414, and Colmenarez et al. '866 disclosures suffer from other deficiencies. Images captured through a pinhole reflect low brightness levels and high noise levels due to low light transmission through the pinhole. Undesirable "screen door" imaging anomalies can also occur with these approaches. Display performance and brightness are also degraded due to the pinhole areas producing dark spots on the display. Overall, pinhole camera solutions inherently compromise both display image quality and capture image quality.

As just indicated, a structure of integrated capture pixels intermingled in a display may cause artifacts for either the image capture system or the image display performance. To some extent, the capture pixel structures can be thought of as defective pixels, which might be corrected or compensated for by appropriate methods or structure. As an example, European Patent Application EP1536399, entitled "Method and device for visual masking of defects in matrix displays by using characteristics of the human vision system" to Kimpe, describes a method for reducing the visual impact of defects present in a matrix display using a plurality of display elements and by providing a representation of a human vision system. The Kimpe EP1536399 disclosure describes at least one defect present in the display deriving drive signals for at least some of the plurality of non-defective display elements in accordance with the representation of the human vision system, characterizing the at least one defect, to reduce an expected response of the human vision system to the defect, and then driving at least some of the plurality of non-defective display elements with the derived drive signals. However, a display having an occasional isolated defective pixel is a different entity than a display having a deliberate sub-structure of intermingled capture aperture or pixels. Thus the corrective measures to enhance display image quality can be significantly different.

One difficulty with a number of conventional solutions relates to an inability to compensate for observer motion and changes in the field of view. Among approaches to this problem have been relatively complex systems for generating composite simulated images, such as that described in U.S. Patent Application Publication No. 2004/0196360 entitled "Method and apparatus maintaining eye contact in video delivery systems using view morphing" by Hillis et al. Another approach to this problem is proposed in U.S. Pat. No. 6,771,303 entitled "Video-teleconferencing system with eye-gaze correction" to Zhang et al. that performs image synthesis using head tracking and multiple cameras for each teleconference participant. However, such approaches side-step the imaging problem for integrated display and image capture devices by attempting to substitute synthesized image content for true real-time imaging and thus do not meet the need for providing real-life interaction needed for more effective video-conferencing and communication.

The proliferation of solutions proposed for improved teleconferencing and other two-way video communication shows how complex the problem is and indicates that significant problems remain. Thus, it is apparent that there is a need for a combined image capture and display apparatus that would allow natural two-way communication, provide good viewer eye contact, adapt to different fields of view and changes in scene content, provide good quality capture images with reduced artifacts, and provide a sufficiently bright display without noticeable defects in the displayed image.

SUMMARY OF THE INVENTION

In accordance with this invention, there is provided an integrated imaging apparatus for displaying images while capturing images of a scene, comprising:

a) an electronic display having an array of display pixels which are used to display image content;

b) a plurality of apertures are integrated within the display, wherein each of the apertures includes at least one partially transparent pixel; and c) a plurality of capture devices each of which captures an image, and includes at least a lens and an image sensor array;

wherein each capture device is operatively associated with at least part of a particular aperture of the display; and wherein the partially transparent pixels also provide light for image content display.

The present invention provides an apparatus comprising an integrated image display and image capture device that provide improved capture capability and improved display image quality. In addition, using the solution of the present invention, image capture conditions can be changed in response to changes in the scene.

BRIEF DESCRIPTION OF THE DRAWINGS

In the detailed description of the preferred embodiments of the invention presented below, reference is made to the accompanying drawings in which.

DETAILED DESCRIPTION OF THE INVENTION

The apparatus and method of the present invention address the need for an integrated display and image capture device by taking advantage of a combination of factors including the following:

(i) fabrication of display device components of various types having substantially transparent electrode materials;

(ii) use of light modulation components that can be alternately emissive (or absorptive or reflective) and transparent;

(iii) timing to synchronize alternating image capture and image display functions for various apparatus components;

(iv) structural device layout and design to enhance image capture and image display; and (v) corrective methods to enhance image quality for image capture and image display.

Significantly, the apparatus and method of the present invention avoid the pitfalls of compound imaging, as was described earlier with reference to the examples of the Tsuboi '8332, Uy '7222, and Zanaty '0973 disclosures by using imaging optics and sensor components, rather than merely using sensors that detect light and attempting to assemble an image by tiling or other image synthesis methods. In addition, the apparatus and method of the present invention avoid problems typically associated with pinhole imaging, as was described earlier with reference to the Rambo et al. '562, Ting '414, and Colmenarez et al. '866 disclosures. This is because the apparatus and method of the present invention utilize transparency properties of various types of display components to provide a suitable aperture for imaging, without significant detriment to display image quality.

It should be noted that drawings used to show embodiments of the present invention are not drawn to scale, but are illustrative of key components and principles used in these embodiments. Moreover, it must be emphasized that the apparatus of the present invention can be embodied in a number of different types of systems, using a wide variety of types of supporting hardware and software.

Figure 2A:
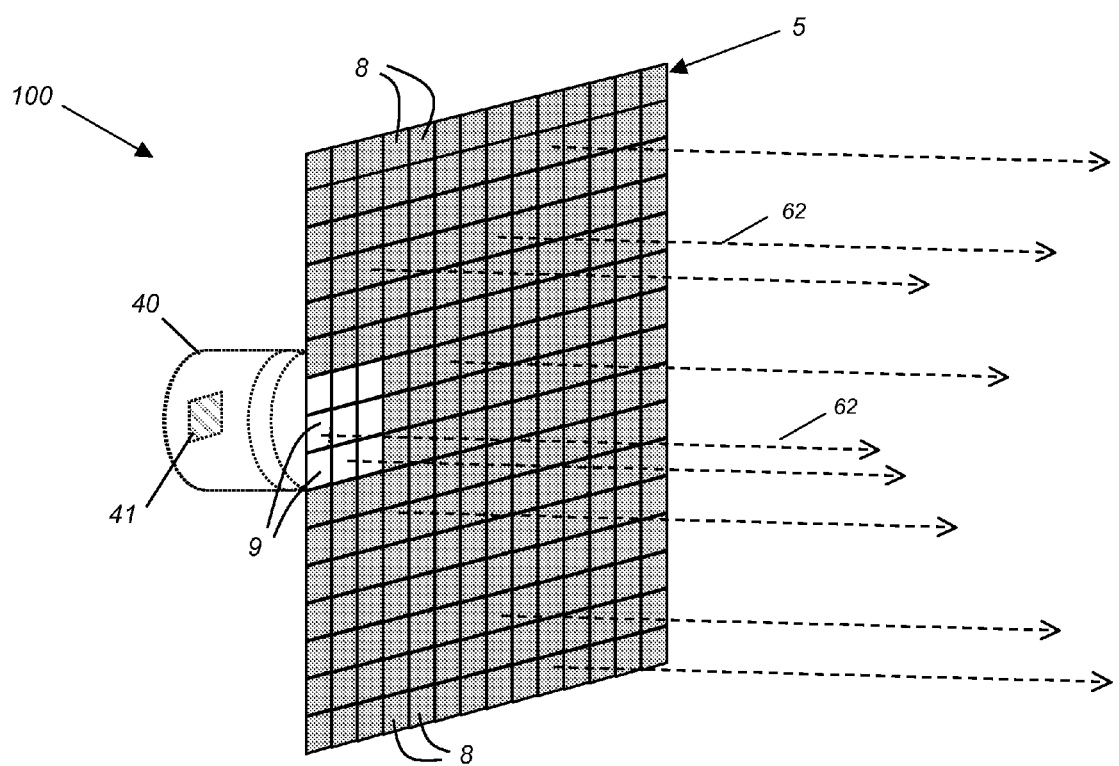
FIGS. 2A and 2B are perspective views showing an apparatus in accordance with the present invention, operating in a display mode and in an image capture mode, respectively.
Figure 2B:
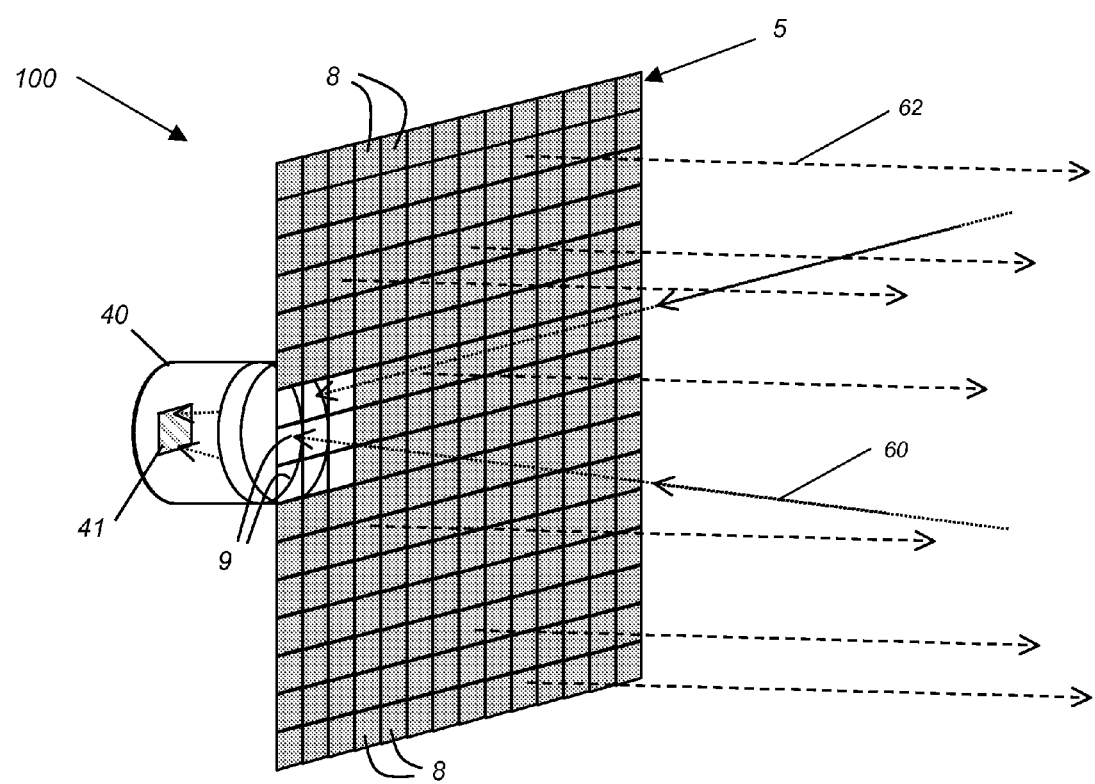
Figure 3:
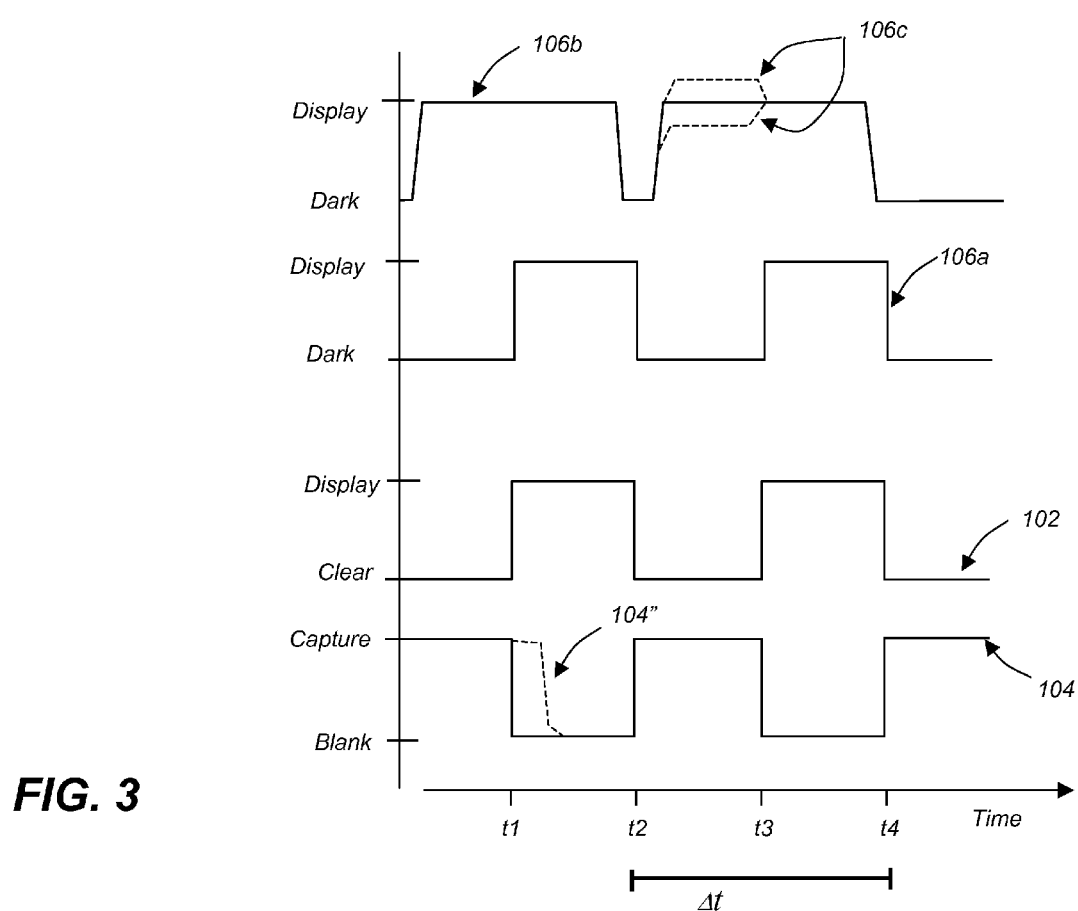
FIG. 3 shows a timing diagram for image display and image capture for the present invention.

FIGS. 2A and 2B show an important feature of operation that is utilized by the apparatus and method of the present invention. An integrated display and capture apparatus 100 of the present invention generally includes a display 5 and one or more capture devices 40. Display 5 has an arrangement of pixel elements or pixels 8 and 9 that form a display screen that is observed by one or more viewers (not shown). Display pixels 8, shown shaded in FIGS. 2A and 2B, are conventional display pixels, such as emissive OLED pixels or transmissive LCD pixels. Pixels 9, shown white or clear in FIGS. 2A and 2B, also act as display pixels, but are fabricated and controlled to be at least partially transparent, and are thus termed as at least partially transparent (or semi-transparent) display pixels 9 in the present application. Capture device 40 is nominally a digital or video camera having a lens 42 for directing light toward an image sensor 41 for capturing a plurality of image pixels. In the depiction of FIG. 2A, at least partially transparent pixels 9 are in a display mode, contributing a portion of display image light 62. Pixels 9 either emit light (for an OLED display) or transmit (or reflect) light (for an LCD display). In the depiction of FIG. 2B, at least partially transparent pixels 9 are in a transparent mode or clear mode, and receiving incident light 60 from a distant scene. The timing chart of FIG. 3 shows a display timing pattern 102 for at least partially transparent pixels 9 and a capture timing pattern 104 for capturing an image from the image sensor 41. A frame time (Δt) is spanned by one full cycle through ON and OFF states (an exemplary 50% duty cycle is shown). When the at least partially (in time) transparent pixels 9 are in a clear or transparent state, an image capture cycle can be executed, as is shown in FIG. 2B. When the at least partially transparent pixels 9 are in a display state, nominally no image capture takes place. The timing patterns (106a,b,c) for the operation of the display pixels 8 will be discussed subsequently.

Figure 4:
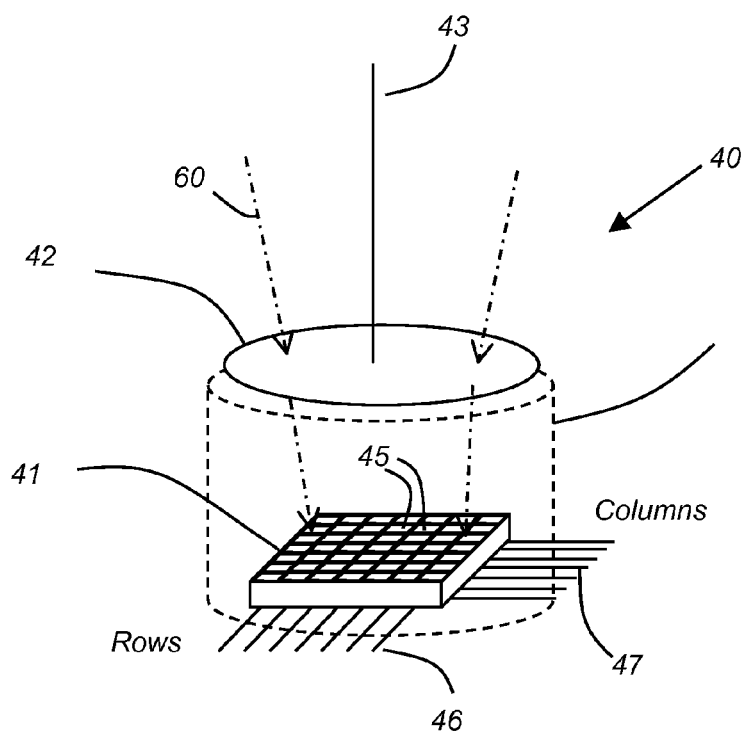
FIG. 4 is a perspective of an image capture device as used in the present invention.

As is shown in FIG. 4, the capture device 40 includes imaging optics with an optical axis 43. The basic components of capture device 40 are the lens 42 and an image sensor 41, optionally encased in a housing 44 (shown in dotted lines in FIG. 4). Image sensor 41 has an array of sensor pixels 45, arranged in rows 46 and columns 47, as is well known in the imaging arts. Incident light 60, represented by dotted lines, is directed toward image sensor 41 by lens 42 to form an image thereon. Baffles (not shown) internal to lens 42 can be provided to minimize any stray light or ghost images from degrading the image capture. Lens 42 can employ folded optics the thickness of the housing. Image sensor 41 can capture an image having a large number of pixels. Image sensor 41 is likely a CCD or CMOS sensor array, having a resolution of ~1-8 megapixels. The image that is captured can be a full scene image or a portion or tile of a larger, composite image. Unlike many of the display/capture device solutions of earlier approaches that attempt to capture a single pixel using a sensor optically coupled to a lenslet, the use of an image sensor 41 in the present invention acts as a camera and provides a two-dimensional image from each capture device 40.

As noted earlier, transparency of display components at least during image capture is an important attribute for their implementation in the integrated display and capture device 100 of the present invention. Subsequent figures and description outline a number of embodiments using this principle with image sensor 41 and employing the timing and synchronization described with reference to FIGS. 2A, 2B, and 3.

Figure 5:
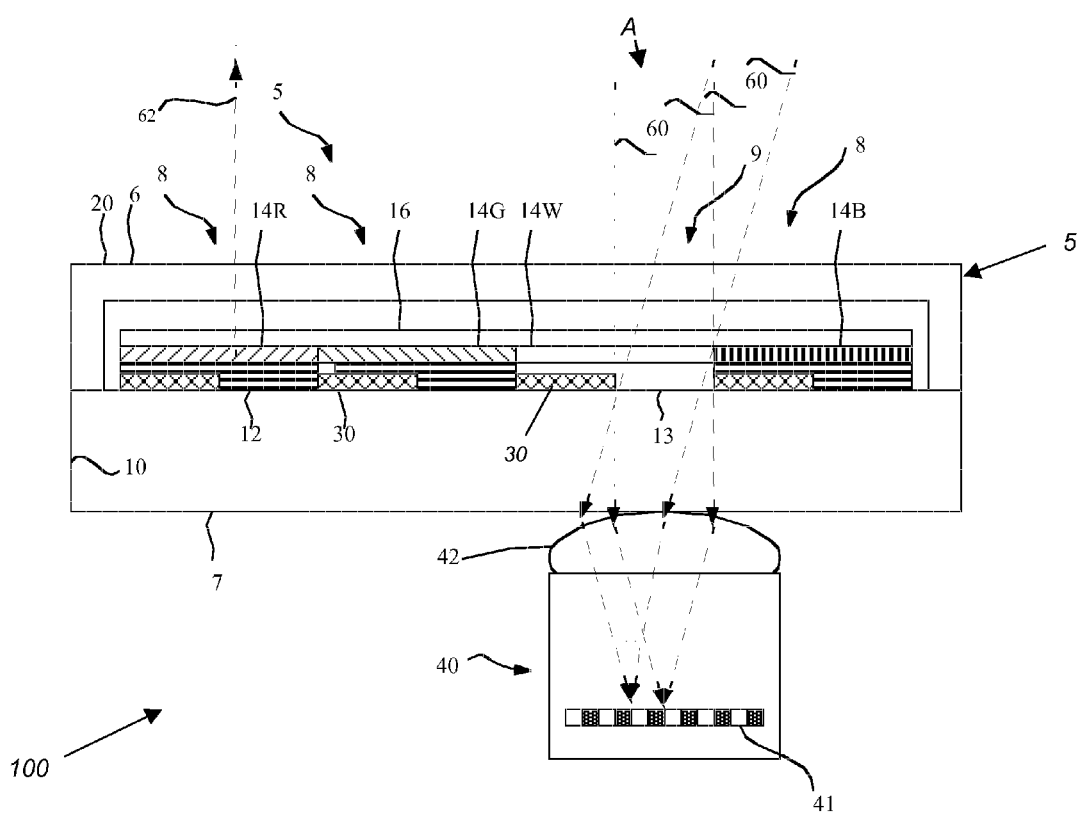
FIG. 5 is a cross section of one embodiment of the present invention.

Referring to FIG. 5, one embodiment of an integrated display and the capture apparatus 100 according to the present invention includes display 5 having a plurality of display pixels 8 wherein one or more of the display pixels 8 is at least partially transparent (as shown by at least partially transparent display pixel 9 in FIG. 5) and partially opaque (as shown by display pixels 8 in FIG. 5). Capture device 40 has an image sensor 41 for capturing a plurality of image pixels, as described earlier with reference to FIG. 4.

Display 5 has a first side 6 from which it is viewed. Capture device 40 is located on a second side 7 opposite the first side 6, in a position corresponding to the location of the at least partially transparent display pixel 9. Capture device 40 receives light 60 from the scene on first side 6 through at least partially transparent pixel 9 to form an image of the scene. In one embodiment of the present invention, display 5 is formed on a substrate 10 and includes a cover 20 adhered to the substrate 10 for protecting the display 5. The first side 6 from which the display is viewed can be the cover 20 side; second side 7 can be the substrate 10 side and the capture device 40 located adjacent to substrate 10, with light emitted through cover 20. Alternately, capture device 40 can be located on cover 20 side with light emitted from the substrate 10 side. In one embodiment of the present invention, display pixels 8 include a reflective electrode 12 and a common transparent electrode 16. Display pixels 8, which can be either monochrome or color pixel, emit light in a forward direction (towards a display viewer), with the back-emitted light re-directed forwards by the reflective electrode 12. The semi-transparent pixel 9 that is at least partially transparent can include two transparent electrodes 16 and 13. As shown, there is a particular type of display pixel 8, which is a white light emitter 14W, which includes a semi-transparent pixel 9 and a portion with a thin film electronic component 30. Thin film electronic components 30 can be electrodes, transistors, resistors, or other basic circuitry components.

As the term is employed herein, a partially transparent pixel is one that transmits sufficient light to form an effective image when viewed or recorded by a capture device 40. For apparatus of the present invention, at least 50% transparency is needed and better than 80% transparency is preferred. Transparency is possible by virtue of device design and composition. For example, OLED devices, because they use thin-film components, can be fabricated to be substantially transparent, as has been described in the article "Towards see-through displays: fully transparent thin-film transistors driving transparent organic light-emitting diodes," by Gorrn et al., in Advanced Materials, 2006, 18(6), 738-741. Typically, the patterned materials are deposited in thin films (e.g. 100 nm thick) that are effectively transparent. In the case of an OLED display, display pixels 8 can include a layer 14 of patterned organic materials 14R, 14G, 14B that emit red, green, or blue light respectively. In the case of a monochrome display, display pixels 8 and semi-transparent pixels 9 can both emit white light. OLED devices are well known in the display imaging arts.

Another alternative for providing transparency is using LCD display technology. Where display 5 is an LCD display, layer 14 includes switchable liquid crystals that switch between a transparent and a light-absorbing state. Reflective and transparent electrodes are known in the art and can include, for example, metals and metal oxides such as reflective aluminum or silver layers and transparent indium tin oxide conductors. Transparent electrodes can also be somewhat reflective, formed, for example, from thin layers of silver. LCD devices are similarly well known in the display imaging arts. In particular, the general architecture of a trans-reflective LCD, in which the pixels have both reflective and transmissive portions could be extended to create an integrated display and capture device.

As shown in FIG. 5, transparent display pixel 9 forms an aperture A in the display screen through which image sensor 41 obtains light 60. The size of aperture A, or window, through which one or more capture devices look, is an important factor for the performance of the system. Optically, it is desirable that the size of the aperture A be as large as possible. An aperture A should be large enough (for example, >25 μm) that significant diffraction effects are not imparted to the light 60 in such a way that the image formed by the capture device 40 would be degraded. Increasing the size of aperture A increases the optical throughput of the light 60 available to a capture device 40, enabling a brighter image with less noise. Larger effective apertures A with less intervening structure will also help lens focusing, as there will be less "screen door effect" to confuse the lens. Also, as it is difficult to make small cameras having optical components such as lens 42 and image sensor 41, it is preferred to make the aperture A as large as possible.

For the apparatus and method of the present invention, the relationship of aperture A to pixel size is important. As is well known, pixel size can vary significantly between devices. In some large-format display devices, the pixel size can be on the order of 0.05 to 1 mm$^2$ in area. In particular, current cell phone displays typically have pixels that are ~0.1-0.2 mm wide, while computer monitors use ~0.3 mm wide pixel structures, and large panel entertainment systems have 0.5-0.8 mm wide pixel structures. Embodiments described subsequently outline approaches for arranging pixels in such a way as to maximize aperture A as well as to compensate for inherent problems in obtaining a sufficiently sized or sufficiently transparent aperture A. For example, for the displays 5 of FIGS. 7, 8, and 10, the effective aperture size A is increased with pixel structures in which regions of transparency are expanded by greater use of semi-transparent materials (such as ITO electrodes) or pixel patterning to enhance aperture adjacency. In other cases (FIGS. 9 and 15), the effective aperture A is increased by having image capture devices 40 look through multiple offset transparent pixels (9). However, it should be noted that the design of these apertures A of semi-transparent pixels (or ensembles thereof), including their size and patterning, needs to be designed with consideration for their visibility as potential display artifacts for a display user. Nominally the capture device 40 is aligned to be centered and normal (optical axis perpendicular to) an aperture A, unless it is deliberately askew, including being tilted or panned to track motion.

Figure 6:
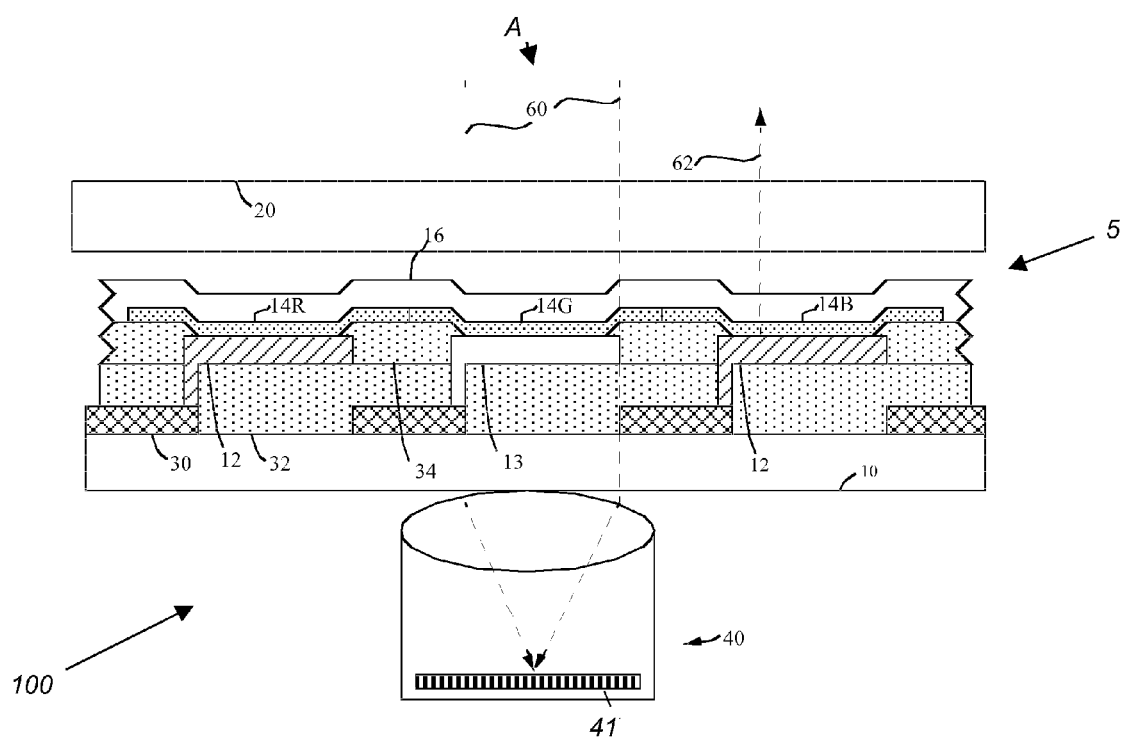
FIG. 6 is a more detailed cross section of the embodiment of FIG. 5.

According to another embodiment of the present invention for an integrated display and capture apparatus 100, display pixels 8 are active-matrix pixels that include thin-film electronic components 30 to control the light emission or reflection of the display pixels. Referring to FIG. 6, display 5 has thin-film electronic components 30 are formed on substrate 10. Planarization layers 32 and 34 are employed to smooth layer surfaces and provide insulation between layers and between electrodes 12 and 13 formed in a common layer. In one embodiment, the thin-film electronic components are formed on relatively opaque silicon. Electrode 13, within aperture A, is transparent. Emitted light 62 can be provided from both transparent and opaque pixels.

Figure 7:
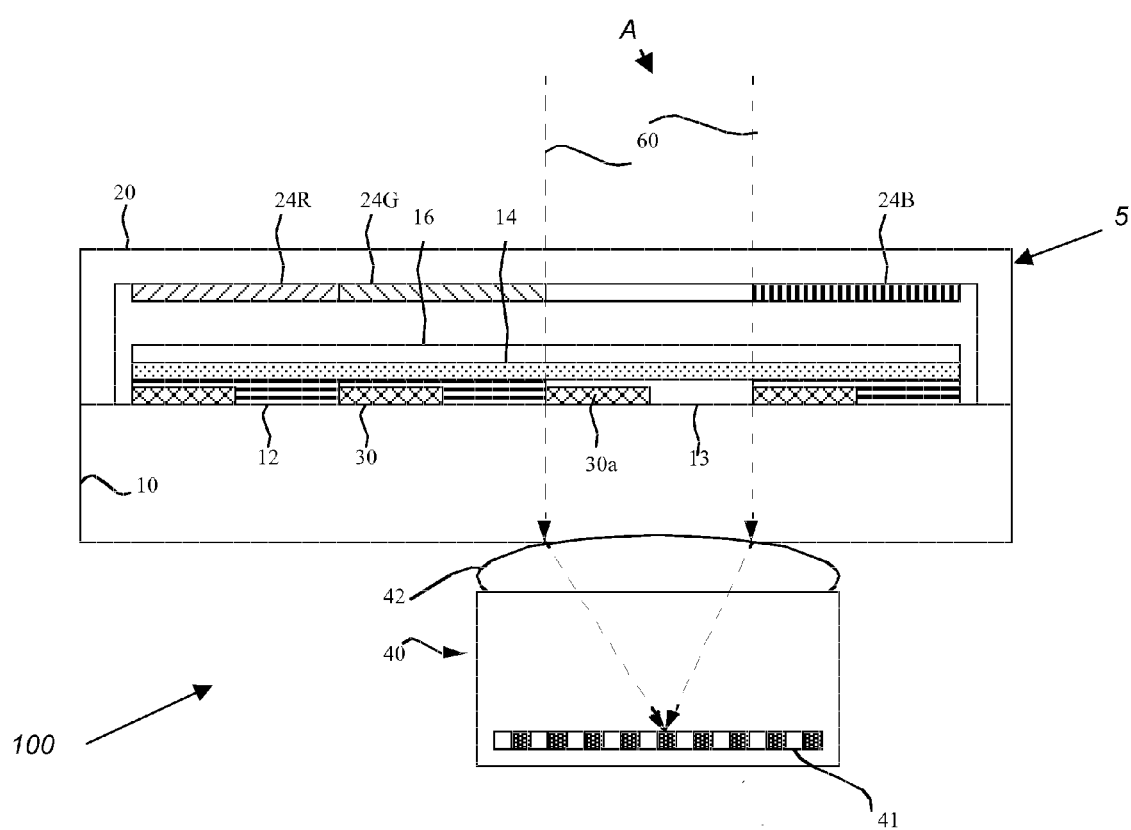
FIG. 7 is a cross section of an alternative embodiment of the present invention having transparent thin-film electronic components.

Referring to the embodiment of FIG. 7, display 5 has thin-film electronic components are formed of one or more transparent materials, for example zinc oxide or doped zinc oxide, and indium tin oxide (ITO). As an example, light 60 can pass through any thin-film electronic components 30 which are "relatively transparent", such as partially transparent electrodes 30a, to be incident upon image sensor 41. Thus, the size of semi-transparent pixels can effectively be expanded, thereby increasing the aperture A size and improving the performance of the capture device 40.

Figure 8:
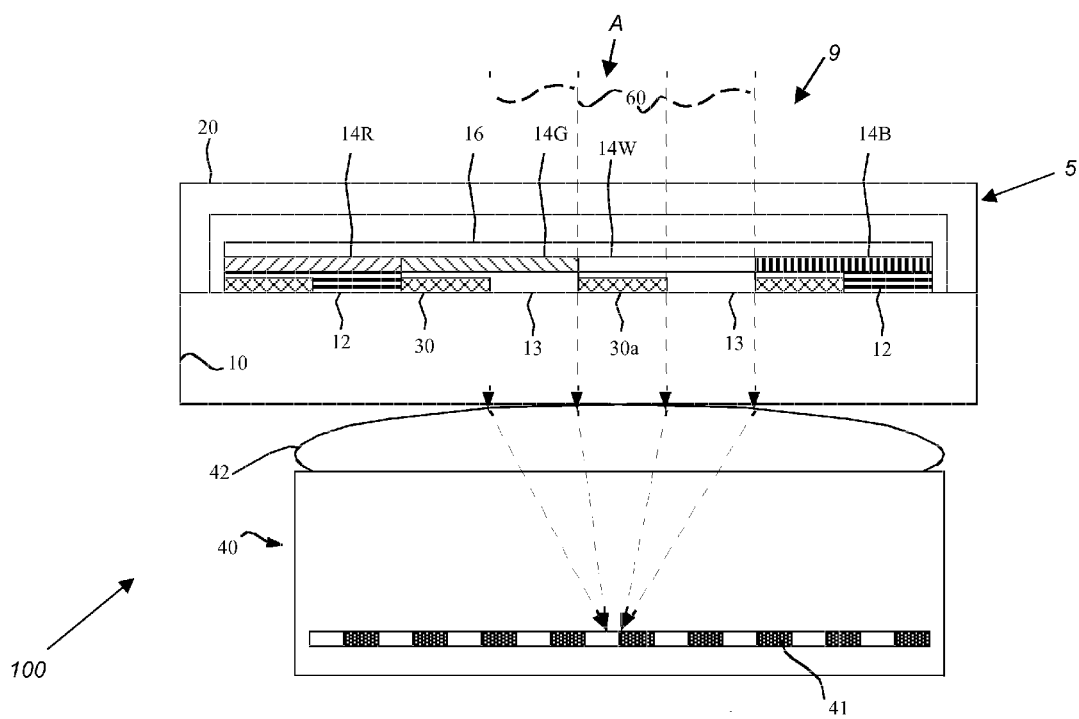
FIG. 8 is a cross section of a further embodiment of the present invention having a plurality of transparent display pixels.

In FIG. 8, the capture device 40 receives light 60 through multiple display pixels 8 and 9 of display 5, thereby increasing aperture A. In the example shown, some amount of light is obtained from the imaged scene through the portion of light emitting pixel 14W, including semi-transparent pixel 9, and further light from the portion with a partially transparent electrode 30a. Image light is also collected through at least a portion of green color pixel 14G, which is partially transparent layer of green patterned organic 14G material in an OLED device. The aperture A can be expanded further by providing other color-emitting pixels with a partially transparent electrode 30a instead of a nominally opaque electrode (30). Likewise, the partially transparent electrode 30a of pixel 14W can be of the light blocking variety (30). Even so, the effective aperture A is still increased, as incident light 60 passes through both the semi-transparent pixel portions of the white pixels (9) and the color pixels. Of course, any semi-transmissive color pixels that are also functioning as windows for image capture should be off (not light emitting) during the capture time. Various other spatial arrangements of partially transparent display pixels 9 can be employed, with filtered or non-filtered light directed toward image sensor 41, as is described subsequently.

Figure 9:
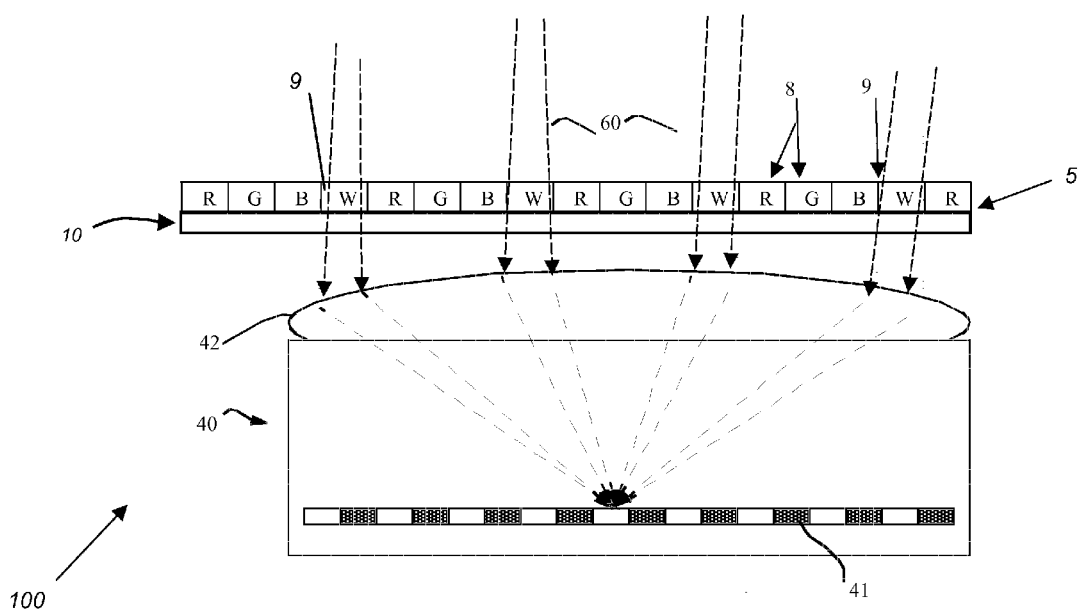
FIG. 9 is a cross section of another embodiment of the present invention having a plurality of transparent display pixels of a common color.

FIG. 9 shows another embodiment for apparatus 100 in which light is obtained through an aperture A that comprises a plurality of offset or spaced apart window pixels that are interspersed among the display pixels. In FIG. 9, the depicted light transmitting or window pixels are only at least partially transparent display pixels 9. In this embodiment, all of at least partially transparent display pixels 9 emit the same color light, white in this case. However, the spaced apart light transmitting pixels could be both white and color pixels, distributed individually or in clusters, to form aperture A. Since, with either OLED or LCD devices, different colors can have different light emission efficiencies, it can be useful to group commonly-colored transparent pixels to reduce differences between the differently colored pixel groups. In particular, white emitters can be more efficient than other colors. Using this improved efficiency can help to mitigate the visual impact of employing a non-reflective electrode.

Figure 10:
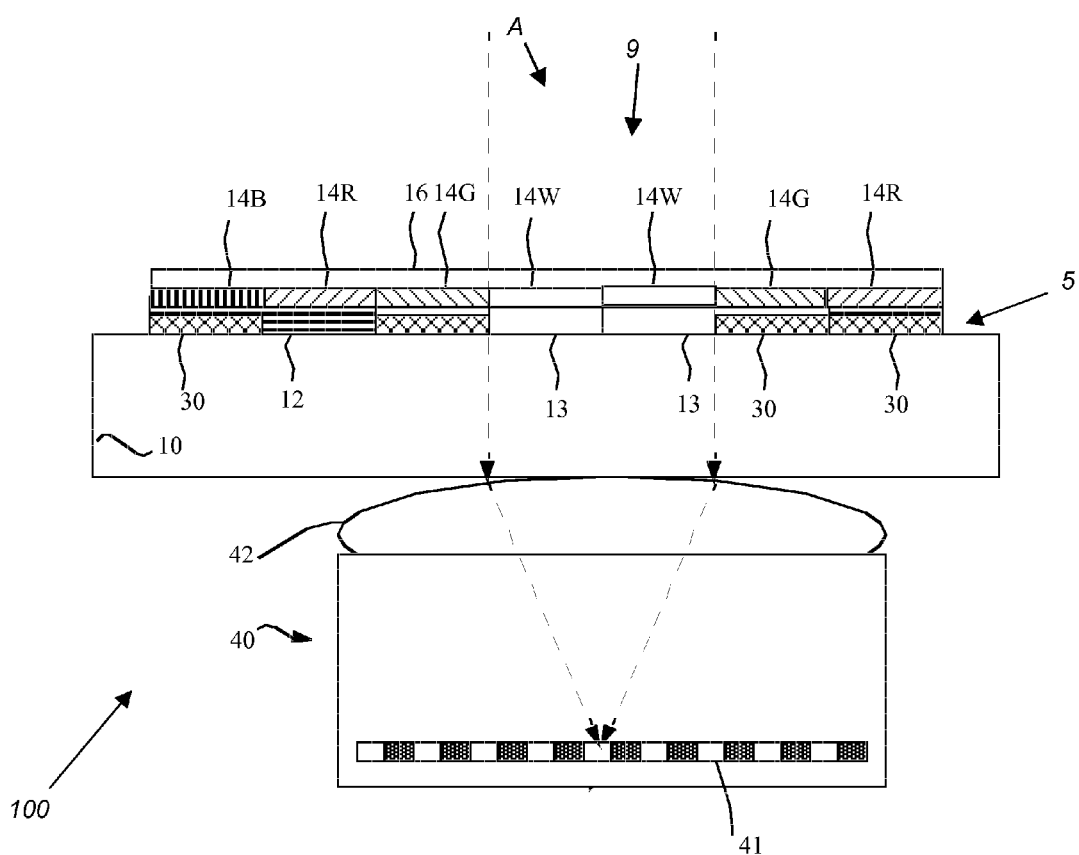
FIG. 10 is a cross section of yet another embodiment of the present invention having adjacent transparent portions.
Figure 11:
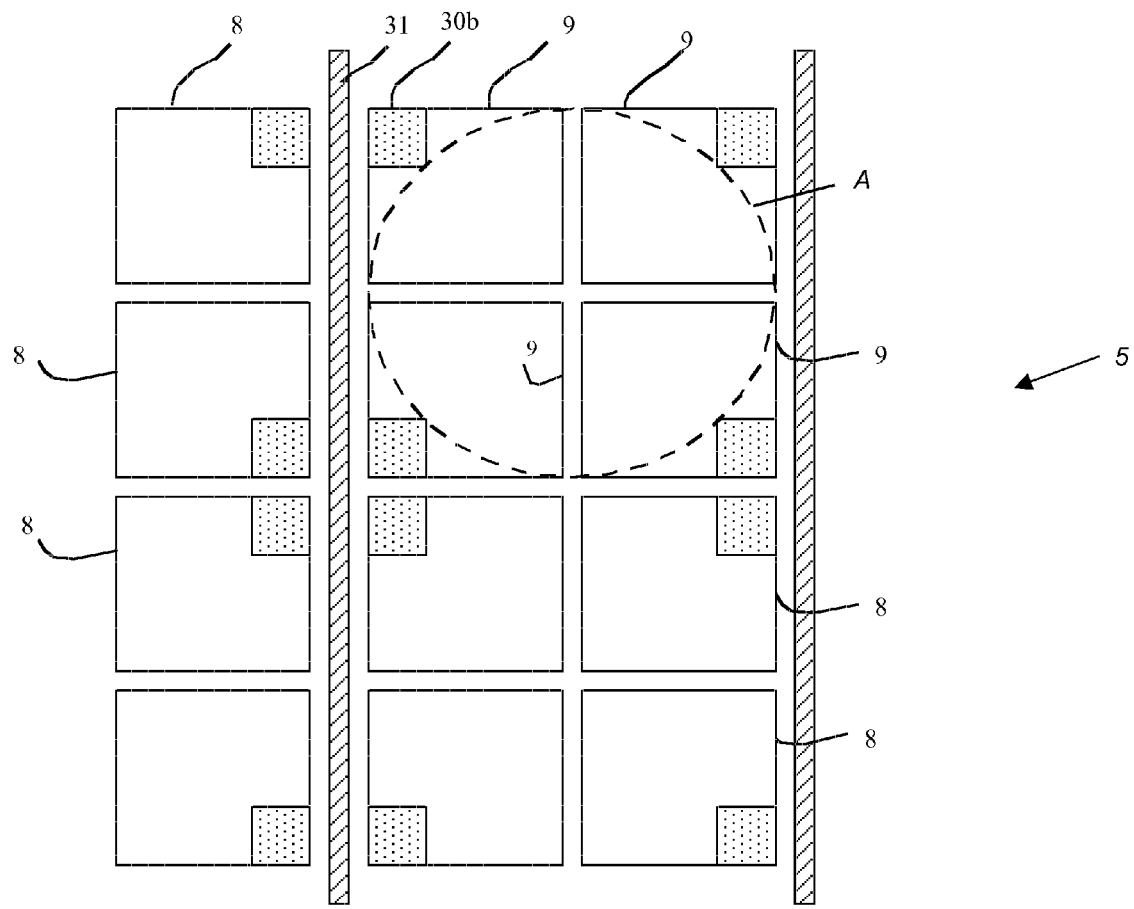
FIG. 11 is a top view of the embodiment of FIG. 10.

As another alternative embodiment for integrated display and image capture apparatus 100, shown in FIG. 10, the effective aperture A can be increased beyond that available through a single partially transparent display pixel 9 by fabricating the display 5 with the partially transparent display pixels 9 clustered or adjacent. In these cases, the capture device 40 can be larger and can thus receive more light, possibly increasing the signal of image sensor 41. Reflected pixel layouts can be arranged to accomplish this as taught in commonly assigned, above cited U.S. Ser. No. 11/341,945. Referring to FIG. 11, a top view of a portion of display 5 having such an arrangement is shown. Here, the component layout employs a bus connector 31, thin-film transistors 30b, and at least partially transparent pixels 9 located adjacent to each other to form an increased aperture A generally indicated by the dashed oval.

In an OLED embodiment of the present invention employing patterned organic materials to form light emitters, the organic materials do not significantly absorb light that passes through the at least partially transparent display pixels 9. In an LCD embodiment, the liquid crystals are likewise substantially transparent. In these embodiments, the capture device 40 can employ additional color filters to form a color image of the scene on the first side 6 of the display 5.

Figure 12:
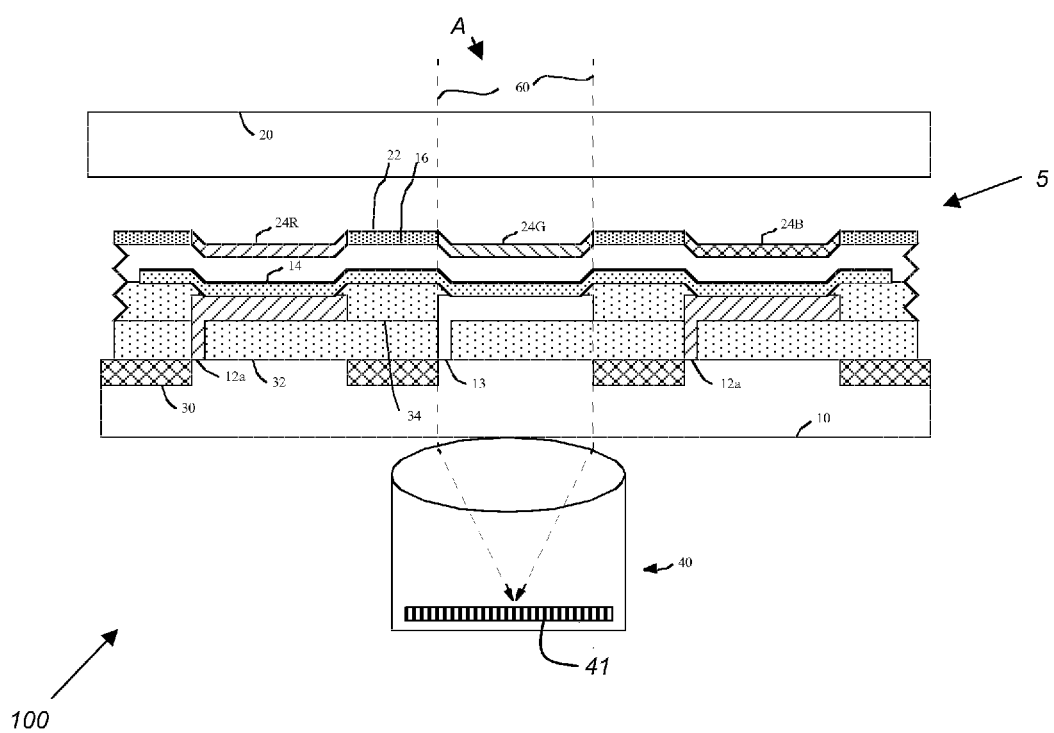
FIG. 12 is a cross section of an alternative embodiment of the present invention having common light-emitting materials and color filters.

Referring to FIG. 12, there is shown an OLED embodiment of the present invention employing unpatterned organic materials 14 to form broadband light emitters together with color filters 24R, 24G, and 24B to form a color display. In this embodiment, the color filters 24R, 24G, and 24B can significantly absorb light that passes through them, providing a colored image to capture device 40. If an RGBW configuration is employed, the white emitter does not have any color filter. If capture device 40 is located in alignment with such a white pixel with no color filters, then the capture device 40 will not receive colored light. Hence, the capture device 40 can form a monochrome or a color image record without the need for separate color filters on image sensor 41. An optional black matrix 22 can be employed to reduce ambient reflection. The color filters 24R, 24G, and 24B can be located on the electrode as shown in FIG. 12 or on the inside of the protective cover 20 as shown in FIG. 7.

Figure 13:
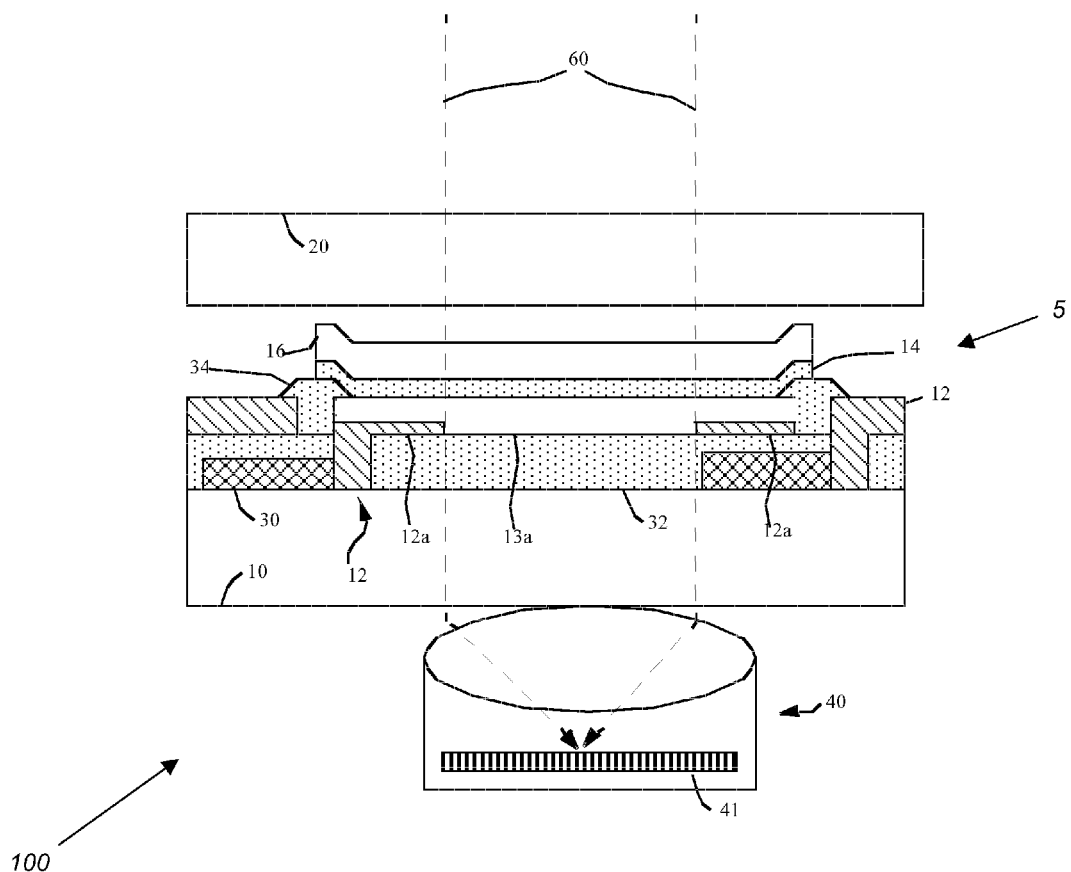
FIG. 13 is a cross section of an additional embodiment of the present invention having an electrode with reflective and transparent portions.

Referring to FIG. 13, reflective electrode 12 of display 5 can have a reflective area 12a and a transparent area 13a through which light passes to capture device 40. In particular, for top-emitter structures such as is shown in FIGS. 5, 7, 8, and 10, a portion of the bottom electrode is formed over areas corresponding to thin film electronic components 30 such as thin-film transistors, and another portion is formed for the areas between these thin-film components (transistors (30)). In such instances, it can be useful to provide the reflective area 12a above the areas corresponding to thin-film transistors (30) and the transparent area 13a for the areas between the thin-film transistors (30). In this way, the use of emitted light is maximized. Such an electrode structure can be formed by providing a reflective, possibly conductive layer in the reflective areas 12a only and a transparent layer over both the reflective areas 12a and the transparent areas 13a as shown in FIG. 13.

Figure 14A:
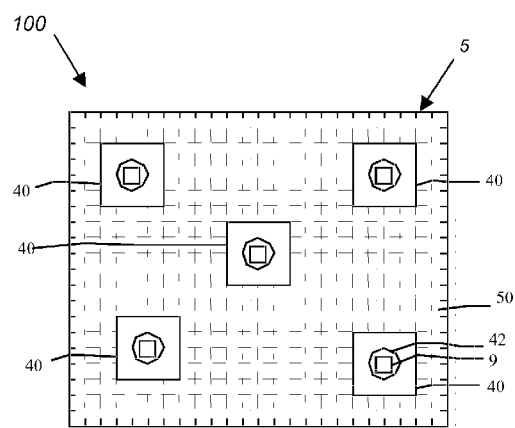
FIG. 14A is a top view of a further embodiment of the present invention having multiple transparent portions and image capture devices.

In operation, the display 5 is controlled to emit or control light that forms a display image on the first side 6 of the display 5, as was shown in FIG. 5. Ambient light 60 that illuminates a scene on the first side 6 is incident on the display 5, passes through the one or more semi-transparent display pixels 9, and is sensed by image sensor 41 of capture device 40 to form an image of the scene on the first side 9. As shown in FIG. 14a, integrated display and capture apparatus 100 can be equipped with one or more capture devices 40 that look through the display 5. This plurality of capture devices (cameras) 40 can have different imaging attributes, either individually or in combination. Most likely, these devices use lenses that have different focal lengths, and image with different fields of view (such as wide angle and telephoto) or magnifications. A lens for one camera 40 can have zoom capability, while the other lenses do not. These cameras 40 can have different numbers of pixels (different sensor resolutions), different spectral sensitivities of the light-sensing elements, different color filters, and other varying attributes. Some of these cameras 40 can be mounted with means (not shown) to facilitate pan and tilt functionality, to enable motion tracking in the user/viewer scene environment. Thus, the plurality of capture devices 40 can be directed to look at different parts of a scene, in an overlapping or a non-overlapping manner. An image processor 120 can output either multiple images or multiple image data (video) streams, or composite images or composite image streams. A controller 122 could facilitate both automatic and manual control of the variable features (zoom, pan, tilt, changing field of view, changing scene brightness, etc.) of the capture devices 40 to respond to changing scene conditions.

Figure 15:
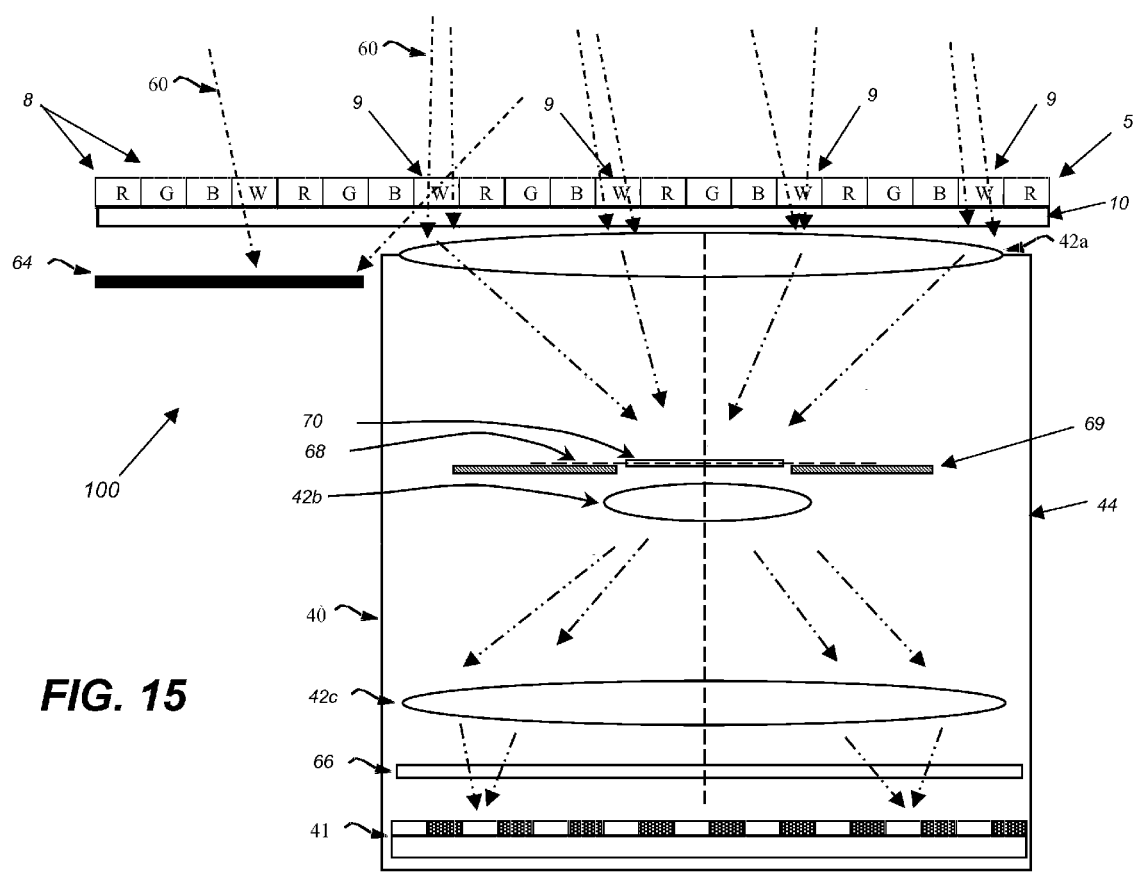
FIG. 15 is a cross section of an alternative embodiment of the present invention having Fourier plane spatial filtering.

As shown in FIG. 15, the capture device 40 can include a spectral filter 66 somewhere prior to image sensor 41. Depending on the application, spectral filter 66 could be a band pass or band rejection filter. For example, spectral filter 66 could be a filter that transmits red and infrared light (600-1200 nm, for example) while rejecting ultraviolet, blue, green, and out of band infrared light. As another option, spectral filter 66 could be a filter that preferentially transmits ultraviolet light. In such cases, the associated image sensor 41 will also need sufficient sensitivity in the chosen spectral range. Those skilled in the art will recognize that in the case wherein the capture device 40 is designed to operate in extreme low light conditions, it is beneficial to eliminate the spectral filter 66 to allow as much light as possible to reach the image sensor 41.

In addition, it should be noted that in certain cases where it is desirable to produce images with light from outside the visible spectrum (350-700 nm), it is within the scope of the invention to add one or more capture devices 40 that operate outside the visible spectrum such as in the ultraviolet or the infrared. In these cases, it is important to select a lens 42 that will operate in the ultraviolet (below 350 nm) or infrared (above 700 nm) regions. A spectral filter 66 can be used to eliminate light outside the region that is to be imaged. The invention also anticipates the need for capture devices 40 operating inside the visible spectrum to be combined with capture devices 40 operating outside the visible spectrum to enable sequential or simultaneous multi-spectral imaging.

It is recognized that the integrated display and capture apparatus 100 of the present invention, including a display 5 with display pixels 8 and at least partially transparent pixels 9, as well as one or more capture devices 40, can be subject to image artifacts in either the image display or image capture spaces. These potential artifacts include spatial frequency effects, "screen door" effects, pin hole "defect" effects, stray and ghost light issues, color or spectral effects, flicker effects, and non-uniform shading issues. These artifacts (and others), which can occur individually or in combination, can generally be reduced with appropriate hardware designs or image processing corrections, which can likewise be applied individually or in combination. In general, the goal would be to reduce the presence of any image display or image capture artifacts to at least just below the appropriate threshold for human perception thereof, thereby enhancing the image quality. As will be seen, the hardware design and the image processing can both be tailored to meet these needs.

As one example, FIG. 15 illustrates an integrated display and capture apparatus 100 that has baffles 64 to reduce image artifacts for both image display and image capture. Incident light 60 passes through semi-transparent pixels 9 or display pixels 8, and miss a given image capture device 40. That light could enter the capture device 40 after various reflections and scattering events, and create ghost images or flare light, reducing image quality for either the displayed or captured images. Capture device 40 can have an external housing 44 and internal baffles (not shown) that reduces this risk. Additionally, some incident light could re-emerge from behind the display 5, through transparent pixels and display pixels 8, and provide ghosts or flare light into the images seen by a viewer of the display. To counter this, integrated display and capture apparatus 100 is equipped with one or more light absorbing baffles 64, which can include coated plates and surfaces, sheet polymer materials, or light trapping structures. Baffles 64 can be formed on either side of substrate 10 of display 5. It is noted that baffles 64, which are similar to a backing for display 5, are generally distinct from any thin film light absorbing layers that might be provided within the display micro-structure to reduce unintended stray reflections from incoming ambient light. With respect to FIG. 14a, these baffles would be located behind display 5, in the regions at least between the various image capture devices 40. Of course, if semi-transparent pixels 9 are provided only in camera locations (see FIG. 14a), then baffles 64 may not be needed, or may only be need in proximity to apertures A.

Figure 18:
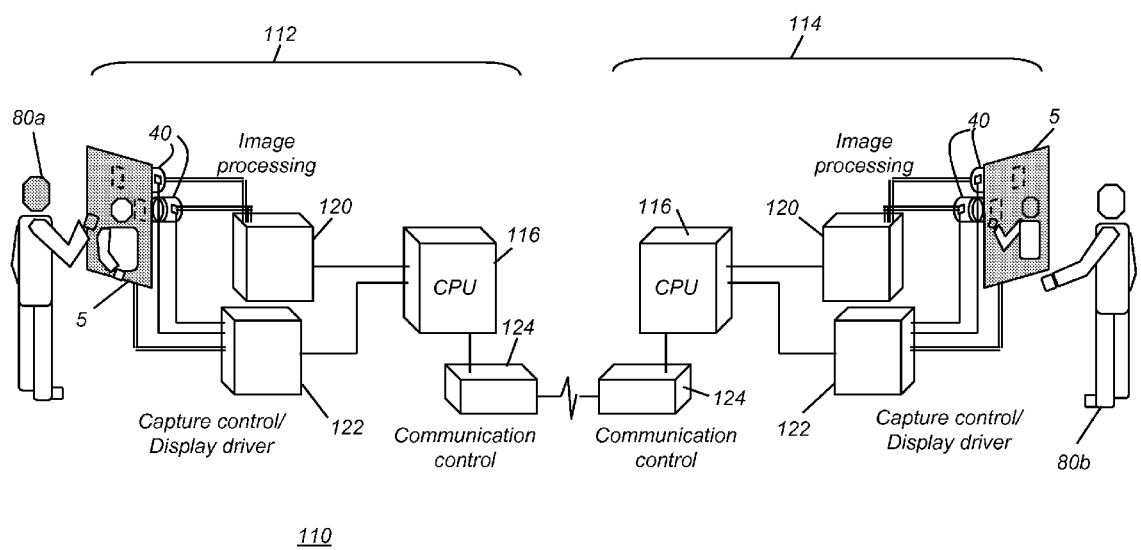
FIG. 18 is a block diagram showing system components of the present invention in a networked embodiment.

The integrated structure of integrated display and capture apparatus 100 can cause various capture image artifacts, including shadowing. For example, some portion of the light incident on image sensor 41 may have been occluded by thin-film electronic components 30 in the optical path. In this case, the capture device 40 records a scene with shadows imaged on image sensor 41. Such shadows can have a regular, periodic structure. Since these shadow areas are out of focus and are caused by a known part of the fixed optical structure of the digital capture device-display system, the effects of the shadows on the image can be modeled, tested, and compensated. Compensation techniques for ambient lighting conditions and for artifacts in the optics such as occlusions of the optical path are known and can be implemented in an image post-processing step. This step can be performed, for example, at image processor 120, as shown in FIG. 18.

The structure of display 5 can also cause other capture image defects, as image content is transmitted differently, removed, or obscured by the device structure. For example, in the case of the FIG. 8 embodiment, a light-transmitting aperture A can span portions of semi-transparent pixels 14W both with and without partially transparent electrodes 30a, as well as portions color emitting pixels (such as 14G) that can also be partially transparent, again either with or without partially transparent electrodes 30a. As these different partially transparent pixels or pixel portions can have different transmittances in at least the blanking state, then the transmittance across an aperture A will vary spatially across the display 5. As long as the objects in the captured scene are sufficiently distant from the display, these transmission variations should be averaged out for all field points. But as the objects become closer, these spatial variations in an aperture A of display 5 could lead to image non-uniformities. These differences can be most readily corrected or compensated for by the image processor 120. Likewise, if the incident light 60 passes through a color filter (24R, 24G, or 24B—see FIG. 7), the image that is obtained at image sensor 41 can be adjusted to compensate for the filtering to correct spatial color variations in the image.

As another example, periodic spatial structures in display 5 can cause capture image artifacts, where image content is removed, or obscured or altered by the effective frequencies of the structure. In some cases, optical compensation or correction techniques could be used. In particular, Fourier plane spatial filtering can be used to reduce the visibility of artifacts caused by regular periodic structures. As an example, an integrated display and capture apparatus 100 is depicted in FIG. 15, where display 5 has a repeating structure of red, green, blue and white pixels. Capture device 40, which includes a lens 42 with multiple lens elements 42a, 42b and 42c and an image sensor 41, looks through a multitude of semi-transparent pixels 9. Depending on the size of the lens 42 and the size and pitch of the semi-transparent pixels 9, the capture device 40 may be looking through several, or several hundreds or more, of semi-transparent pixels 9 that are separated by color (or monochrome) pixels. Relative to the capture device 40, imaging through this array of apertures formed by the semi-transparent pixels 9 can be much like imaging through a screen door, with a consequent loss of light intensity and the distraction of the structure itself, which can make focusing difficult, as well as impacting the image quality of scenes with similar spatial frequencies. Aliasing could also occur. These semi-transparent pixels 9 can include white pixels (as in FIGS. 9, 10, and 11), as well as semi-transparent structures where light is transmitted through nominally transparent electronic components (aperture A of FIG. 7) and/or through semi-transparent patterned color pixel structures (aperture A of FIG. 8).

When the multitude of pixel semi-transparent pixels (9) are spatially repeated in a periodic manner, or even a quasi-periodic manner, a static structure can occur in frequency space. In the case of an optical system, this frequency structure is evidenced in the Fourier plane of a lens system. For example, as shown in FIG. 15, capture device 40 includes image sensor 41 and lens 42 with multiple lens elements (42a, 42b, and 42c). Within this optical system, a Fourier plane 68 exists, at, or in proximity to, an aperture stop 69. Incident light 60, which is incident from multiple locations in the field of view, is collected through semi-transparent pixels 9 and focused or converged towards the Fourier plane 68 (shown by a dashed line) and an aperture stop 69, where after multiple lens elements 42b and 42c create images on image sensor 41. Most easily, spatial filtering with a fixed pattern Fourier plane filter 70 can reduce the fixed or static spatial frequency patterns created by a display structure. For example, this filter can include a (two-dimensional) spatial pattern of highly absorbing regions formed on a transparent substrate, which is mounted between the multiple lens elements 42a, 42b and 42c.

Figure 14B:
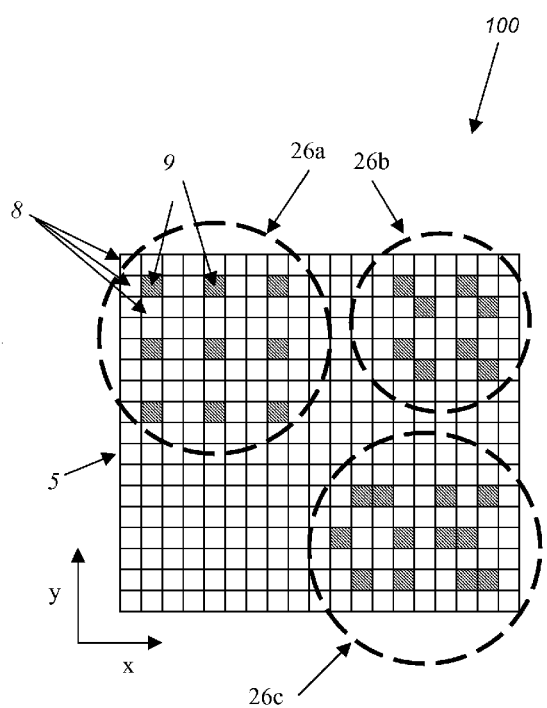
FIG. 14B is a top view of a display of the present invention depicting various exemplary groupings of the semi-transparent pixels.

The distribution or pattern of semi-transparent pixels 9 and apertures A can also create display image artifacts that could affect the display viewer. In designing display 5, there is a choice whether pixels 9 and apertures A occur only where the plurality of capture devices 40 reside (per FIG. 14a) or are across larger areas, and even the entire display 5. As these at least partially transparent pixel 9 structures can be fairly large (~0.1-1.0 mm for a linear dimension) and patterned, they can create visible artifact that irritate the display user. For example, within an area with a pattern with different display intensities, the user can perceive a "banding effect", where the structures appear as an artifact with a several mm pitch that aligns with regions of maximal human spatial pattern sensitivity. The pattern of semi-transparent pixel structures can also create a speckled appearance to the display that could annoy the viewer. For example, in extremum, the pattern of window or transparent pixels could seem like a grid of dark spots (in either a clear/transparent or dark state). This is illustrated in FIG. 14b, in which different pixel groupings (26a, 26b, 26c) of semi-transparent pixels 9 are shown, and pixel groupings 26a and 26b represent regular grids. If the pixels 9 are small enough, they might exist generally unnoticed. However, as an example, the traverse of a displayed motion image across the display could increase their perceptibility for a viewer.

There are various approaches that can be used to reduce the visibility of the semi-transparent pixels 9 (or apertures A) for the display viewer. To begin with, the semi-transparent pixels 9 can only be fabricated where cameras will be located, and not across an entire display. The semi-transparent pixels 9 (white) can also be smaller than the RGB pixels. However, as it is desirable to locate a camera behind the display, at or near the screen center, for the purpose of "eye contact" image capture for teleconferencing applications, further mitigating design features may be needed. The semi-transparent pixels 9 might be kept patterned in the same pitch within a row, but be staggered across rows, to appear less like a regular grid (less like pixel grouping 26a). As another approach, display 5 could have the intermingled semi-transparent pixels 9 (or apertures A) distributed quasi-periodically (pseudo-periodically) or randomly within a capture aperture of the capture device 40, or more broadly, across different regions of the display 5, to reduce this effect. These concepts are exemplified by the illustrated pixel grouping 26c of FIG. 12b. However, as electronic devices, and array electronic devices in particular, are conventionally fabricated with predefined repeating structures, random pixelization would be quite difficult. A quasi-periodic structure is more likely, which could be either identical or non-identical in the XY directions (horizontal and vertical of FIG. 14b) of a display 5. In optical frequency space (Fourier plane 68) for image capture, a quasi-periodic pattern of pixels 9 could create a frequency pattern with gaussian profiles. Fourier plane filter 70 could then have a spatial patterned absorbance that followed a functional dependence (such as a gaussian) in one or more locations, rather than the more traditional pattern of constant high absorbance (or reflectance) regions. Alternately, or in addition, frequency filtering to remove structural display artifacts from the image capture could be done in the capture image processing electronics. The virtue of optical filtering, as compared to electrical/software filtering, is that it occurs without requiring any computing power for data processing.

It can also be desirable to reduce the visibility of the semi-transparent pixels 9 for image capture by modulating these pixels temporally. In a sense, the timing diagram (FIG. 3) would be more complex, as the modulation within a frame time ($\Delta t$) would could be staggered (out of phase) or segmented from one pixel 9 to another. This modulation could change the apparent spatial pattern or frequency of these pixels as perceived by a viewer, whether the display 5 includes groupings (26) of semi-transparent pixels 9 that were periodically or quasi-periodically arrayed. In turn, that could affect the spatial frequency pattern seen at the Fourier plane 68. Conceivably, Fourier plane filter 70 could be a dynamic device, such as a spatial light modulator (such as an LCD or DMD) that was temporally modulated in synchronization with the modulation of pixels 9. However, such synchronized frequency space corrections are likely best handled directly in the image processor 120 that handle the captured images.

The existence of semi-transparent pixels 9 or apertures A can cause non-uniformity artifacts (in addition to flare) that will impact the displayed image, depending on whether these pixels appear dark or bright. The spatial distribution and size of semi-transparent pixels 9 across display 5 very much affects these artifacts. Some of these issues are resolved if the dark state of semi-transparent pixels is a condition of both no light emission and no light transmission. However, there are still cases where display pixels 8 surrounding or adjacent to each of the semi-transparent pixels 9 (or apertures A) can be modulated in a calibrated compensating way to reduce the visibility of the semi-transparent pixels 9 to a viewer of the display. The display scene calibration can be undertaken in a scene dependent way, using the fact that the display electronics has information on the (static) structure of display 5, has control of the pixel modulation timing and intensity, and can pre-process the image to be displayed. For example, when a semi-transparent pixel 9 is in a white state in an area where a generally bright whitish image is being displayed by the color pixels, the proximate display pixels 8 could be darkened to compensate. Likewise, when a semi-transparent pixel 9 (which can only be clear, dark, or white) resides in a displayed screen area of constant color content (say red), the adjacent display pixels 8 could be brightened to compensate for this pixel (as compared to red display pixels 8 further away from a semi-transparent pixel 9). In another sense, the semi-transparent pixels 9 might be used for display image contrast enhancement, given that they can be driven to either clear (dark) or white states.

The application of local or adjacent display pixels 8 to compensate or correct for the operation of a semi-transparent pixel 9, depends on how the display pixels are operated. For example, if non-transparent light emitting display pixels are on or emitting light during most of a frame time $\Delta t$, then they are in operation for some portion (see display timing pattern 106b of FIG. 3) of the clear state for image capture for a semi-transparent pixel 9. The timing of display and capture is then at least somewhat de-coupled, although the defined frame time $\Delta t$ is presumed constant. Local changes in display pixel brightness can be attained by providing an average constant intensity or by actively changing the intensity within a frame time (display timing patterns 106c of FIG. 3). Thus, adjacent or proximate display pixels neighboring a semi-transparent pixel 9 could be driven higher when that pixel switches clear (for example, if the ensemble of proximate color pixels give a white image) or lower or left constant depending on the scene content. If the ON or light emission state timing for the non-transparent light emitting display pixels is comparable to that of the semi-transparent pixels 9 (display timing pattern 106a~semi transparent pixel timing pattern 102), then pixel brightness differences probably can likely only be compensated via differences in display pixel intensity without temporal manipulation. This is particularly true for devices of the FIG. 8 variety, where at least some display pixels 8 have transparent electrode structures rather than reflective electrode structures. In that case, those pixels should follow the same nominal timing diagram (pattern 106a=pattern 102, per FIG. 3) as the semi-transparent pixels 9, so that they do not back emit light towards a capture device 40.

Likewise, on a larger scale, and considering again FIG. 14a, display 5 can be fabricated with semi-transparent pixels 9 or apertures A in places where capture devices 40 are present, or across the entire display 5. In either case, whether these window pixels are across the entire display (suggesting the use of the baffles 64) or only in regions localized for cameras 40, the displayed images could look different in the capture regions versus the non-capture regions. In particular, there can be large areas with a different display appearance than other large areas (that is, large spatial non-uniformities). By and large, these macro-non-uniformities should be anticipated and correctable (perhaps with the help of a calibration step) in the image processing electronics 120, and compensated for in advance of image display.

However, the primary purpose of semi-transparent pixels 9 is to act as windows or apertures for image capture by one or more cameras 40. For an OLED type device, these pixels can be driven to an "ON", light emitting state, to reduce their visibility to a display viewer. But all the pixels within a cameras field of capture nominally need to be "OFF" or transparent for a sufficient time period that a nominally uniform image capture can occur over the capture field of view. Relative to the semi-transparent pixel timing pattern 102 (FIG. 3), the display state definition of a dark pixel can be key. Generally, it is intended that a dark semi-transparent pixel 9 is still ON or in a display state, and does not transmit light to a capture device 40. However, with some designs or device technologies for display 5, a dark state can equate to an OFF/clear state, in which case incident light 60 can be transmitted to the capture device 40. For example, that could mean that a semi-transparent pixel might be left in its clear or transparent state (dark state for the display viewer) for a prolonged period of time (relative to the capture frame time), if it resides in an image region that is dark for a prolonged time period. Light would then be incident to the capture device (camera) 40 during the previously defined blank state. Capture device 40 could have a shutter (not shown) to eliminate this concern. Alternately, a spatially and/or temporally variant correction or gain adjustment might be made for the captured image as the prolonged dark semi-transparent pixels 9 within a cameras field of capture will have much more light transmission in time than the pixels that are reaching ON states.

As was described with reference to FIG. 3, the simplest form of periodic control can be to switch the semi-transparent pixels 9 off (clear) for some portion of time to allow the capture device to capture the scene. Since, nominally, only the at least partially transparent display pixels 9 are switched rather than all of the pixels, the switching can be unobtrusive in the display. Moreover, the image capture can be made in a short portion of a period of time (e.g. $\frac{1}{100}^{th}$ of a second or a portion of a single frame at 30 Hz) reducing both the duty cycle for image capture and the visibility of temporal artifacts. The operation of non-transparent light emitting display pixels is at least somewhat linked to the operation of the semi-transparent pixels 9. For example, if they follow the same timing (pattern 106a=pattern 102), then reducing the off state time means that the same pixel intensity can be attained with less drive loading. Then, if a display pixel (8 or 9) is switched off for 50% of the time while image capture occurs, the display pixel can emit twice the light during the remaining 50% of the time during which the display pixel is switched on. As the time required for image capture lengthens, it becomes more desirable (relative to flicker and instantaneous loading) to decouple the operation of the non-transparent light emitting display pixels from the operation of the pixels comprising a semi-transparent aperture A.

Another image artifact, flicker, can affect both image display and image capture devices. In this case, by employing at least partially transparent display pixels 9 that switch between a non-active (transparent for image capture) and an active (ON) state, while the display pixels are active (emitting or reflecting) during most of the frame time, flicker is reduced relative to the image display. Since only the display pixels having at least partially transparent areas are switched between active and non-active states, the visual effect of the switching on the display quality is reduced and the user experience is improved. Admittedly, having display pixels on during image capture means that some display light can encounter objects in the capture field of view and reflect or scatter back towards the capture devices 40. This light could raise the noise floor, change the spectrum, or temporally alter the captured images. However, the effects of this return light are likely minimal compared to the ambient lighting. Moreover, electrical techniques like supplying clocking or carrier frequency signals could be used to reduce such effects. In the case that the display and semi-transparent pixels (white or color) follow the same timing diagram, it can be desirable to reduce the capture time (smaller duty cycle) or increase the frame rate, to reduce flicker perceptibility.

As previously mentioned, back-emitted light (white or color) from the display 5, for example in an OLED embodiment, with the reflective electrodes replaced by transmissive electrodes, can be incident on image sensor 41. This issue can largely be addressed by only emitting light from these window pixels with matched timing patterns 102 and 106a of FIG. 3. Additionally, capture device 40 can be equipped with a synchronized light blocking shutter or sensor drains. Alternately, it can be desirable to extend image capture (timing pattern 104″) to occur while image display is occurring. That is, the window pixels (semi-transparent pixels 9 and semi-transparent color pixels (per FIG. 8)) of an aperture A would emit light (both forwards and backwards) during at least a portion of image capture. As the display controller 122 knows the light 60 emitted by the display 5, the light emission from the display 5 can be subtracted from the light signal received by image sensor 41 to improve the quality of image capture of the scene. As another option, the light emitted by the at least partially transparent display pixel 9 can be periodically reduced during simultaneous image capture by image sensor 41 to improve the image capture of the scene. In embodiments relying upon controllable light absorption to form an image (e.g. in an LCD), the amount of light absorbed by the partially transparent display pixel 9 is likewise known to a display controller and a correction can be made to the corresponding image sensors to correct for the absorption of ambient light by the partially transparent display pixel 9.

The prior discussions concerning the impact the structure of the integrated display and capture apparatus 100 on the quality of image capture and image display has principally focused on the embodiments integrated display and capture apparatus 100 is an OLED type device and where at least partially transparent pixel 9 is then a light emitting pixel. However, as was previously discussed, integrated display and capture apparatus 100 can also be a LCD type device. Even so, many of the previously discussed image artifacts, such as shadowing, flare light, spatial pattern frequency effects, spectral transmission differences, can affect the quality of the image capture. Likewise, many of the previously discussed image display artifacts, such as pixel pattern perception and local and macro brightness differences, can affect the quality of the image display. Thus, many of the various hardware remedies (quasi-periodic pixel patterning, baffles, Fourier plane filtering, etc.) and image processing remedies (pixel brightness changes, shadow removal, gain and offset adjustments, etc.) can be applied to the LCD case to reduce the presence of such image artifacts.

Figure 1:
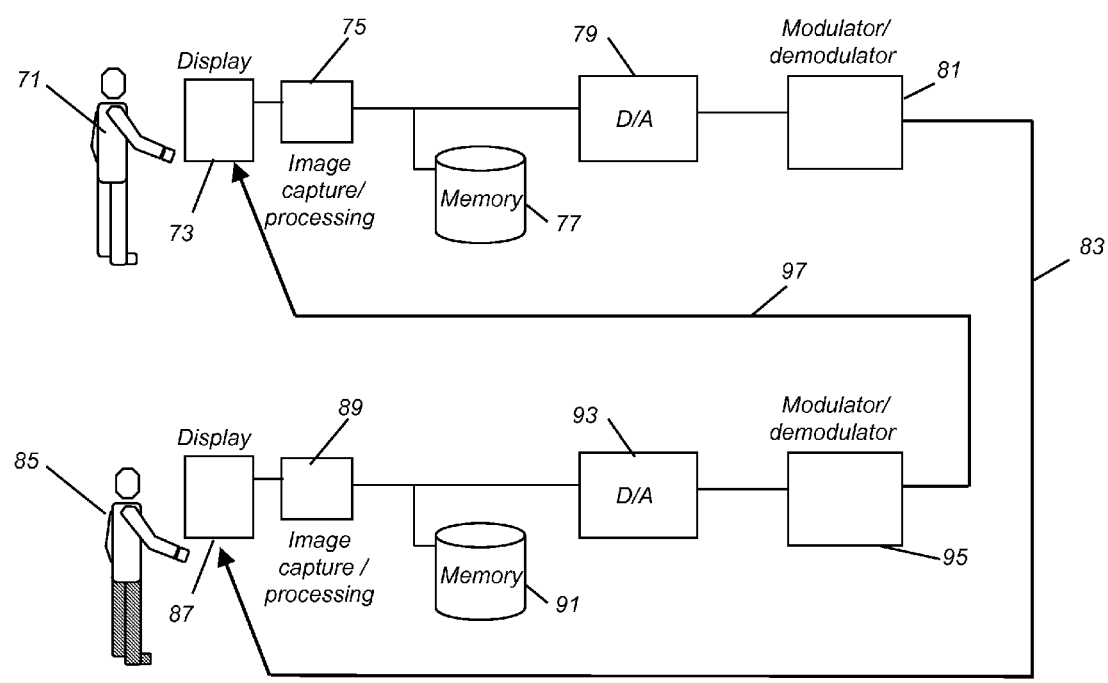
FIG. 1 is a block diagram of a typical prior art telecommunication system.
Figure 16:
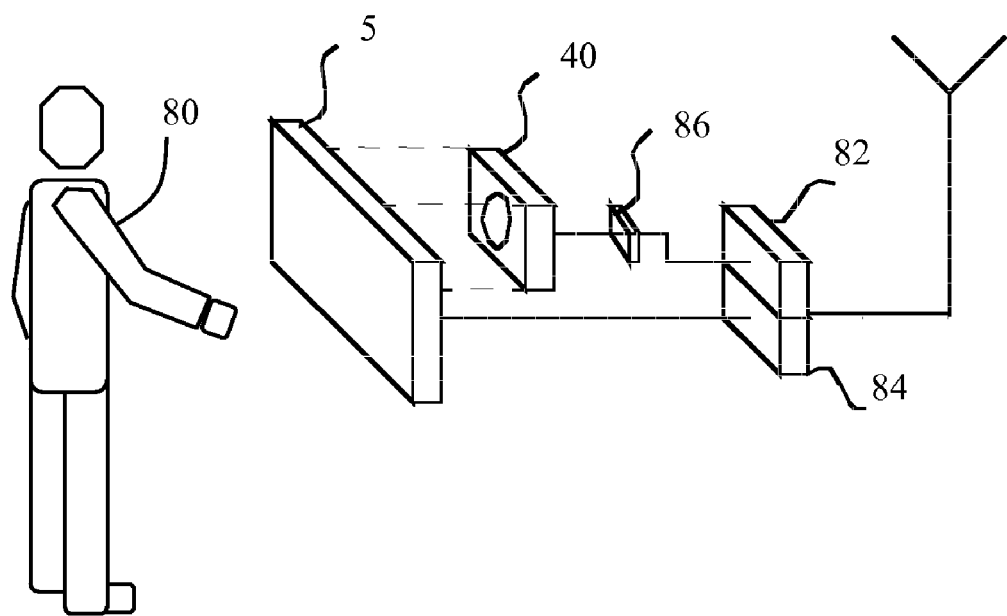
FIG. 16 is a block diagram showing system components of the present invention in one embodiment.

It is also worth considering how the integrated display and capture apparatus 100 of the present invention interacts with a network, particularly given its potential use for telecommunications. Again, for context, FIG. 1, presents a typical prior art two-way telecommunication system is shown wherein the first viewer 71 views the first display 73. A first image capture device 75, which can be a digital camera, captures an image of the first viewer 71. In the present invention, the display and capture apparatus will be much more highly integrated than is implied by FIG. 1. Thus, FIG. 16 shows, in block diagram form, an integrated display and capture apparatus 100 within part of a communications network. A viewer 80 looks at display 5 that includes an integrated digital capture device 40.

Figure 17:
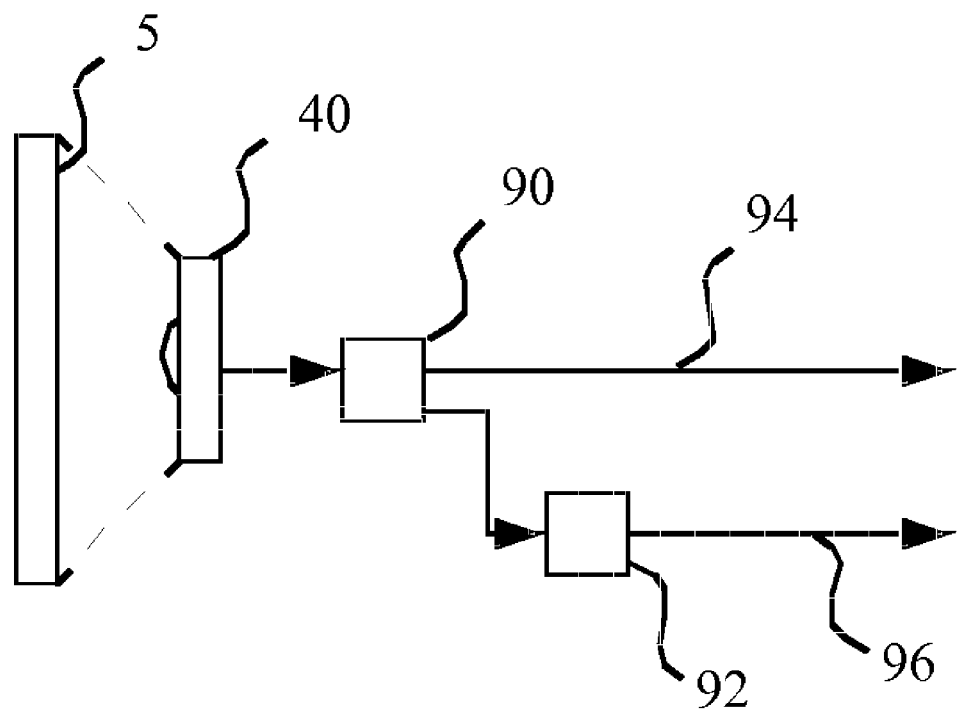
FIG. 17 is a top view showing system components of the present invention in one embodiment.

Capture device 40 obtains an image signal, as described subsequently, and provides the image signal to an image processor 86 that provides the image data for transmission to another site through a modulator 82. A demodulator 84 provides the controlling signals from the other site for operating display 5. The block diagram of FIG. 17 shows a top view of integrated display and capture apparatus 100 in an alternate embodiment having a control logic processor 90 and a communications module 92 for providing the image along a network 94 or 96.

The block diagram of FIG. 18 shows a two-way communication system 110 that utilizes an integrated capture device and a display, for communication between a viewer 80a at a first site 112 and a viewer 80b at a second site 114. Each viewer 80a, 80b has an integrated image capture and display apparatus (100) comprising a display 5 with one or more integrated capture devices 40. A central processing unit (CPU) 116 coordinates control of the image processor 120 and the controller 122 that provides display driver and image capture control functions. A communication control apparatus 124 acts as interface to a communication channel, such as a wireless or wired network channel, for transferring image and other data from one site to the other. In the arrangement of FIG. 17, two-way communication system 110 is optimized to support video conferencing. Each viewer 80a, 80b is able to see the other viewer displayed on display 5 at that site, enhancing human interaction for teleconferencing. Image processing electronics 120 potentially serve multiple purposes, including improving the quality of image capture at the local display 5, improving the quality of images displayed at the local display 5, and handling the data for remote communication (by improving the image quality, data compression, encryption, etc.). It must be noted that FIG. 18 shows a general arrangement of components that serve one embodiment. Capture devices 40 and display 5 are assembled into a frame or housing (not shown) as part of the device integration. This system housing can also encompass the image processor 120, controller 122, CPU 116, and communication control 124. Also not shown are audio communications and other support components that would also be used, as is well known in the video communications arts.

In summary, the present invention provides an effective user experience as the capture device and display are naturally integrated in a mechanically thin package. In particular, the use of at least partially transparent display pixels 9 as opposed to pinholes formed in the display improves the fill factor or aperture ratio of the display, enabling more of the display area to emit or reflect light, thereby improving life times and display image quality. Display resolution can also be improved. Moreover, the use of at least partially transparent display pixels 9 with the capture device 40 located behind the at least partially transparent display pixels 9 allows the remainder of the display area to be reflective or light absorbing, thereby improving the amount of light output or reflected or improving the ambient contrast of the display, improving display image quality as a result. Forming multiple transparent areas improves the image capture capability by increasing the light available to capture devices 40 located behind the transparent areas or enabling a plurality of capture devices 40 to be employed.

The integrated display and capture apparatus 100 of the present invention certainly has potential application for teleconferencing or video telephony. Additionally, this device might be used as an interpretive display for advertising or as an interactive display for video games and other entertainment formats. The displayed image content can include photographic images, animation, text, charts and graphs, diagrams, still and video materials, and other content, either individually or in combination. In particular, the integrated capture and display apparatus 100 could be used to capture an image of one or more display users and then insert their images, in part or in total, into the displayed image content. Other applications for integrated display and capture apparatus 100, in areas such as medical imaging, can be considered. Integrated display and capture apparatus 100 can be sized for cell phone or handheld applications, or for use in a laptop or desktop computer, or for use in an entertainment display. Integrated display and capture apparatus 100 can also be equipped with integrated light emitting devices for the purpose of illuminating a scene, which can be useful if the ambient lighting is low, or an unusual capture spectrum is desired. For example, the illuminating devices might be places around the outer edges of display 5. Likewise, other optical sensing or detection devices could be substituted for image sensor 41 in one or more capture devices 40 used with an integrated display and capture apparatus 100. For example, a low resolution wide angle lens and a quad cell, with simple sum and differencing electronics, could be used to track motion, such as recognizing that someone has entered the capture field of view. A specialized device, such as an optical fingerprint imager could be provided, as a security feature. Alternately, single cell sensors could be used to detect ambient light levels or function as a photovoltaic cell for solar energy conversion. Most basically, an optical sensor needs to generate a useful electrical signal in response to incident light.

The present invention can be employed in display devices. Such display devices can also include additional layers or optical devices, for example protective or encapsulating layers, filters, and polarizers e.g. circular polarizers. In a preferred embodiment, the present invention is employed in a flat-panel OLED device composed of small molecule or polymeric OLEDs as disclosed in but not limited to U.S. Pat. No. 4,769,292, issued Sep. 6, 1988 to Tang et al., and U.S. Pat. No. 5,061,569, issued Oct. 29, 1991 to VanSlyke et al. Many combinations and variations of organic light-emitting displays can be used to fabricate such a device, including both active-matrix and passive-matrix OLED displays having either a top-emitter or bottom-emitter architecture. Other display device technologies can also be used in the present invention, including devices based on inorganic phosphorescent materials, such as quantum dots.

The invention has been described in detail with particular reference to certain preferred embodiments thereof, but it will be understood that variations and modifications can be effected within the spirit and scope of the invention. It should be understood that the various drawing and figures provided within this invention disclosure are intended to be illustrative of the inventive concepts and are not to scale engineering drawings.

PARTS LIST

A aperture
5 display
6 first side
7 second side
8 display pixels
9 at least partially transparent display pixel (or semi-transparent pixel)
10 substrate
12 reflective electrode
12a reflective area
13 transparent electrode
13a transparent area 14 organic layer
14R red patterned organic material
14G green patterned organic material
14B blue patterned organic material
14W white patterned organic material
16 transparent electrode
20 cover
22 black matrix
24R red color filter
24G green color filter
24B blue color filter
26 pixel groupings
26a pixel grouping
26b pixel grouping
26c pixel grouping
30 thin-film electronic components
30a partially transparent electrodes
30b thin film transistors
31 bus connector
32 insulating planarization layer
34 insulating planarization layer
40 capture device (or camera)
41 image sensor
42 lens
42a lens element
42b lens element
42c lens element
43 optical axis
44 housing
45 pixel
46 row
47 column
60 light
62 light
64 baffle
66 spectral filter
68 Fourier plane
69 Aperture stop
70 Fourier plane filter
71 first viewer
73 first Display
75 first image capture device
77 first still image memory
79 first D/A converter
80 viewer
80a viewer
80b viewer
81 first modulator/demodulator
82 modulator
83 first communication channel
84 demodulator
85 second viewer
86 image processor
87 second display
89 second image capture device
90 control logic processor
91 second still image memory
92 communications module
93 second D/A converter
94 network
95 second modulator/demodulator
96 network
97 second communication channel
100 integrated display and capture apparatus
102 semi-transparent pixel timing pattern
104 capture timing pattern
106a display timing pattern
106b display timing pattern
106c display timing pattern
110 two-way communication system
112 site
114 site
116 central processing unit (CPU)
120 image processor
122 controller
124 communication control apparatus

The invention claimed is:

1. An integrated imaging apparatus for displaying images while capturing images of a scene, comprising:
a) an electronic display having an array of display pixels which are used to display image content;
b) a plurality of apertures are integrated within the display, wherein each of the apertures includes at least one partially transparent pixel;
c) a plurality of capture devices each of which captures an image, and includes at least a lens and an image sensor array;
wherein each capture device is operatively associated with at least part of a particular aperture of the display; and
wherein the partially transparent pixels also provide light for image content display and wherein each aperture includes a plurality of patterned partially transparent pixels, either individually or in clusters, in a periodic or quasi-periodic manner.

2. The apparatus of claim 1, which further comprises image processing electronics, which affect the quality of the displayed image content, or the quality of the captured images, or both.

3. The apparatus of claim 2, wherein the image processing electronics includes means for enhancing the quality of the captured images relative to factors that includes; shadowing, frequency artifacts, spatial non-uniformities, spectral differences, or image flicker, or combinations thereof.

4. The apparatus of claim 2 wherein the image processing electronics form a composite image from captured images obtained from the plurality of image capture devices.

5. The apparatus of claim 1 wherein the partially transparent display pixels are periodically controlled to alternately emit light and emit no light.

6. The apparatus of claim 1 wherein the partially transparent pixels are one or more of a red, green, blue, or white pixels.

7. The apparatus of claim 1, wherein the partially transparent display pixels are periodically controlled to be partially transparent.

8. The apparatus of claim 1 wherein the image capture devices are selected to span a range of different imaging attributes, which includes different focal lengths, different capture fields of view, different magnifications, different resolutions, or different spectral sensitivities, or combinations thereof.

9. The apparatus of claim 1 wherein the plurality of image capture devices have different spectral sensitivities that range both inside and outside of the visible spectrum.

10. The apparatus of claim 1 wherein there is a plurality of non-adjacent apertures having baffles that are light absorbing or light blocking provided in the intervening spaces between apertures.

11. A method for simultaneously displaying and capturing images from an integrated electronic device comprising:
a) providing an electronic display for displaying a first image and having an array of display pixels and intermingled partially transparent pixels; and b) operating the partially transparent pixels in a periodic manner, providing both light emission and light transmission states within a frame time;
capturing a scene image with one or more image capturing devices, each or which looks though at least one of the partially transparent pixels; and
c) wherein the output intensity of the display pixels is changed within, the frame time to compensate for the operation of the partially transparent pixels.

12. The method for simultaneously displaying and capturing images according to claim 11 in which both the displayed images and the captured images are subject to image processing to improve image quality.

13. The method for simultaneously displaying and capturing images according to claim 11 wherein the display pixels are used to provide display light for the display image content during at least the portion of a frame time that the partially transparent pixels are operating to emit light.

14. The method for simultaneously displaying and capturing images according to claim 11 wherein the display pixels are used to provide display light for the display image content only during the portion of a frame time that the partially transparent pixels are operating to emit light.

15. The method for simultaneously displaying and capturing images according to claim 11 wherein the one or more image capture devices capture the scene image only during the portion of a frame time that the partially transparent pixels are operating to transmit light.

16. An integrated imaging apparatus for displaying images while capturing images of a scene, comprising:
a) an electronic display having an array of display pixels which are used to display image content;
b) a plurality of image capture devices, each of which includes at least an imaging lens and an image sensor array;
c) wherein each of the image capture devices looks through an aperture in the display, the aperture having at least one partially transparent pixel;
and wherein the partially transparent pixels also provide light for image content display;
d) wherein at least one of the apertures is formed by a plurality of partially transparent pixels;
e) wherein the plurality of partially transparent pixels forming at least one of the apertures is patterned contiguously to form the aperture; and
f) wherein the plurality of partially transparent pixels is patterned, either individually or in clusters in a periodic or quasi-periodic manner.

17. The apparatus of claim 16 wherein the plurality of image capture devices are selected to span a range of different imaging attributes, which includes different focal lengths, different capture fields of view, different magnifications, different resolutions, or different spectral sensitivities, or combinations thereof.

18. The apparatus of claim 16, which further comprises image processing electronics, which affect the quality of the displayed image content, or the quality of the captured images, or both.

19. The apparatus of claim 18 wherein the image processing electronics form a composite image from captured images obtained from the plurality of image capture devices.

20. The apparatus of claim 16 wherein the partially transparent display pixels are periodically controlled to alternately emit light and emit no light.

21. The apparatus of claim 16 wherein the partially transparent pixels are one or more of a red, green, blue, or white pixel.

22. The apparatus of claim 16, wherein the display pixels are in operation to provide display light for the display image content during at least the portion of a frame time that the partially transparent pixels provide image content display light.

* * * * *